(12) United States Patent
Park et al.

(10) Patent No.: US 10,483,456 B2
(45) Date of Patent: *Nov. 19, 2019

(54) SEMICONDUCTOR MEMORY DEVICE

(71) Applicant: SAMSUNG ELECTRONICS CO., LTD., Suwon-si, Gyeonggi-do (KR)

(72) Inventors: Sang Hwan Park, Hwaseong-si (KR); Whankyun Kim, Seoul (KR); Keewon Kim, Suwon-si (KR); Youngman Jang, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/191,727

(22) Filed: Nov. 15, 2018

(65) Prior Publication Data

US 2019/0088857 A1 Mar. 21, 2019

Related U.S. Application Data

(63) Continuation of application No. 15/814,588, filed on Nov. 16, 2017, now Pat. No. 10,153,422, which is a continuation of application No. 15/244,498, filed on Aug. 23, 2016, now Pat. No. 9,825,216.

(30) Foreign Application Priority Data

Oct. 16, 2015 (KR) .................. 10-2015-0144891
Nov. 19, 2015 (KR) .................. 10-2015-0162681

(51) Int. Cl.
*H01L 43/02* (2006.01)
*H01L 43/08* (2006.01)
*H01L 27/22* (2006.01)
*H01F 10/32* (2006.01)
(Continued)

(52) U.S. Cl.
CPC ......... *H01L 43/02* (2013.01); *H01F 10/3254* (2013.01); *H01F 10/3272* (2013.01); *H01L 27/222* (2013.01); *H01L 43/08* (2013.01); *H01L 43/10* (2013.01); *H01L 27/228* (2013.01); *H01L 43/12* (2013.01)

(58) Field of Classification Search
CPC ....... H01L 43/02; H01L 43/08; H01L 27/222; G11C 11/14–16; G11C 11/161
See application file for complete search history.

(56) References Cited

U.S. PATENT DOCUMENTS 6,847,547 B2   1/2005  Albert et al.
7,826,258 B2  11/2010  Zhu et al.
8,339,754 B2  12/2012  Zhang et al.
(Continued)

*Primary Examiner* — Allison Bernstein
(74) *Attorney, Agent, or Firm* — Lee & Morse, P.C.

(57) ABSTRACT

A semiconductor memory device includes free magnetic pattern on a substrate, a reference magnetic pattern on the free magnetic pattern, the reference magnetic pattern including a first pinned pattern, a second pinned pattern, and an exchange coupling pattern between the first and second pinned patterns, a tunnel barrier pattern between the reference magnetic pattern and the free magnetic pattern, a polarization enhancement magnetic pattern between the tunnel barrier pattern and the first pinned pattern, and an intervening pattern between the polarization enhancement magnetic pattern and the first pinned pattern, wherein the first pinned pattern includes first ferromagnetic patterns and anti-ferromagnetic exchange coupling patterns which are alternately stacked.

20 Claims, 17 Drawing Sheets

(51) Int. Cl.
*H01L 43/10* (2006.01)
*H01L 43/12* (2006.01)

(56) References Cited

U.S. PATENT DOCUMENTS

| | | |
|---|---|---|
| 8,796,796 B2 | 8/2014 | Watts et al. |
| 8,824,108 B2 | 9/2014 | Fuji et al. |
| 9,047,968 B2 | 6/2015 | Keshtbod |
| 9,166,146 B2 | 10/2015 | Wang et al. |
| 9,178,136 B2 | 11/2015 | Wu et al. |
| 9,202,545 B2 | 12/2015 | Sato et al. |
| 2014/0077319 A1 | 3/2014 | Noma et al. |
| 2015/0123223 A1 | 5/2015 | Kim et al. |

SEMICONDUCTOR MEMORY DEVICE

CROSS-REFERENCE TO RELATED APPLICATIONS

This is a continuation application based on pending application Ser. No. 15/814,588, filed Nov. 16, 2017, which in turn is a continuation of application Ser. No. 15/244,498, filed Aug. 23, 2016, now U.S. Pat. No. 9,825,216 B2, issued Nov. 21, 2017, the entire contents of both being hereby incorporated by reference.

Korean Patent Application Nos. 10-2015-0144891, filed on Oct. 16, 2015 and 10-2015-0162681, filed on Nov. 19, 2015, in the Korean Intellectual Property Office, and entitled: "Semiconductor Memory Device," are incorporated by reference herein in its entirety.

BACKGROUND

1. Field

Embodiments relate to a semiconductor memory device and, more particularly, to a semiconductor memory device including magnetic tunnel junction pattern.

2. Description of the Related Art

As portable computing devices and wireless communication devices have been widely used, high-dense, low-power and non-volatile memory devices have been demanded. A magnetic memory device may satisfy these demands, and thus various researches are conducted for the magnetic memory device.

In particular, a tunnel magnetoresistance (TMR) effect shown in a magnetic tunnel junction pattern may be used as a data storage mechanism of a magnetic memory device. Magnetic tunnel junction patterns having TMRs of hundreds % to thousands % have been reported in 2000s. Thus, magnetic memory devices including magnetic tunnel junction patterns have been developed.

SUMMARY

Embodiments provide a semiconductor memory device capable of improving electrical characteristics.

According to some example embodiments, a semiconductor memory device may include a free magnetic pattern on a substrate, a reference magnetic pattern disposed on the free magnetic pattern and including a first pinned pattern, a second pinned pattern, and an exchange coupling pattern between the first and second pinned patterns, a tunnel barrier pattern between the reference magnetic pattern and the free magnetic pattern, a polarization enhancement magnetic pattern between the tunnel barrier pattern and the first pinned pattern, and an intervening pattern between the polarization enhancement magnetic pattern and the first pinned pattern. The first pinned pattern may include first ferromagnetic patterns and first non-magnetic patterns which are alternately stacked. The second pinned pattern may include second ferromagnetic patterns and second non-magnetic patterns which are alternately stacked. The second ferromagnetic patterns may include the same ferromagnetic material as the first ferromagnetic patterns, and the second non-magnetic patterns may include a different non-magnetic material from the first non-magnetic patterns. In some example embodiments, the number of the first ferromagnetic patterns stacked in the first pinned pattern may be smaller than the number of the second ferromagnetic patterns stacked in the second pinned pattern.

In some example embodiments, the first pinned pattern may include an odd number of the first ferromagnetic patterns and an even number of the first non-magnetic patterns. A thickness of an even-numbered one of the first ferromagnetic patterns may be greater than thicknesses of odd-numbered ones of the first ferromagnetic patterns.

In some example embodiments, the first pinned pattern may include an even number of the first ferromagnetic patterns and an even number of the first non-magnetic patterns. A thickness of an odd-numbered one of the first ferromagnetic patterns may be substantially equal to a thickness of an even-numbered one of the first ferromagnetic patterns.

In some example embodiments, thicknesses of the second ferromagnetic patterns of the second pinned pattern may be substantially equal to each other.

In some example embodiments, the free magnetic pattern and the polarization enhancement magnetic pattern may be in contact with the tunnel barrier pattern.

In some example embodiments, the first pinned pattern may have a different crystal structure from the polarization enhancement magnetic pattern.

In some example embodiments, the polarization enhancement magnetic pattern may have the same crystal structure as the free magnetic pattern.

In some example embodiments, the polarization enhancement magnetic pattern may include a magnetic material of which a magnitude of a magnetic moment is greater than a magnitude of a magnetic moment of the first pinned pattern.

In some example embodiments, each of the first non-magnetic patterns may include a non-magnetic material that couples the first ferromagnetic patterns adjacent to each other in such a way that magnetic moments of the adjacent first ferromagnetic patterns are anti-parallel to each other.

In some example embodiments, the intervening pattern may include a non-magnetic material that is in contact with the polarization enhancement magnetic pattern and one of the first ferromagnetic patterns of the first pinned pattern to couple the polarization enhancement magnetic pattern and the one first ferromagnetic pattern in such a way that a magnetic moment of the polarization enhancement magnetic pattern is parallel to a magnetic moment of the one first ferromagnetic pattern.

In some example embodiments, the first and second ferromagnetic patterns may include cobalt (Co). The first non-magnetic patterns may include iridium (Ir). The second non-magnetic patterns may include platinum (Pt).

In some example embodiments, the intervening pattern may include tungsten (W), molybdenum (Mo), or tantalum (Ta).

In some example embodiments, the reference magnetic pattern and the free magnetic pattern may have a magnetization direction substantially perpendicular to an interface between the tunnel barrier pattern and the free magnetic pattern.

In some example embodiments, the semiconductor memory device may further include: a selection transistor integrated on the substrate; a contact plug electrically connected to the selection transistor; and a bottom electrode pattern electrically connected between the selection transistor and the contact plug.

In some example embodiments, the semiconductor memory device may further include: a selection transistor integrated on the substrate; a contact plug electrically connected to the selection transistor; a bottom electrode pattern electrically connected between the contact plug and the second pinned pattern of the reference magnetic pattern; and a seed pattern between the bottom electrode pattern and the second pinned pattern of the reference magnetic pattern.

In some example embodiments, the seed pattern may include ferromagnetic layers and non-magnetic layers which are alternately stacked. The seed pattern may have a similar crystal structure to the second pinned pattern.

According to some example embodiments, a semiconductor memory device may include a free magnetic pattern on a substrate, a reference magnetic pattern disposed on the free magnetic pattern and including a first pinned pattern, a second pinned pattern, and an exchange coupling pattern between the first and second pinned patterns, a tunnel barrier pattern between the reference magnetic pattern and the free magnetic pattern, a polarization enhancement magnetic pattern between the tunnel barrier pattern and the first pinned pattern, and an intervening pattern between the polarization enhancement magnetic pattern and the first pinned pattern. The first pinned pattern may include first ferromagnetic patterns and anti-ferromagnetic exchange coupling patterns which are alternately stacked.

According to some example embodiments, a semiconductor memory device may include a free magnetic pattern, a tunnel barrier pattern on the free magnetic pattern, and a pinned magnetic structure on the tunnel barrier pattern. The first pinned magnetic structure may include a first pinned pattern including first ferromagnetic patterns having magnetic moments that are pinned anti-parallel to each other, a second pinned pattern, and an anti-ferromagnetic exchange coupling pattern between the first and second pinned patterns, wherein a net magnetic moment of the pinned magnetic structure is substantially the same as a magnetic moment of the free magnetic pattern.

In some example embodiments, the first pinned pattern may further include anti-ferromagnetic coupling patterns, each being disposed between two adjacent first ferromagnetic patterns to couple magnetic moments of the two adjacent first ferromagnetic patterns anti-parallel to each other.

In some example embodiments, the semiconductor memory device may further include a polarization enhancement magnetic pattern between the tunnel barrier pattern and the first pinned pattern and an intervening pattern between the polarization enhancement magnetic pattern and the first pinned pattern, wherein the polarization enhancement magnetic pattern may include a magnetic material with a magnetic moment having a magnitude that is greater than a magnitude of a magnetic moment of the first pinned pattern, and wherein the magnetic moment of the polarization enhancement magnetic pattern may be coupled in parallel with the magnetic moment of one of the first ferromagnetic patterns, and the one first ferromagnetic pattern may be closest the polarization enhancement magnetic pattern.

In some example embodiments, the second pinned pattern may include second ferromagnetic patterns and non-magnetic patterns which are alternately stacked, the second ferromagnetic patterns include the same ferromagnetic material as the first ferromagnetic patterns, and the non-magnetic patterns include a different non-magnetic material from the anti-ferromagnetic exchange coupling patterns.

In some example embodiments, the free magnetic pattern and the polarization enhancement magnetic pattern may be in contact with the tunnel barrier pattern, and polarization enhancement magnetic pattern and the first pinned pattern are in contact with the intervening pattern.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
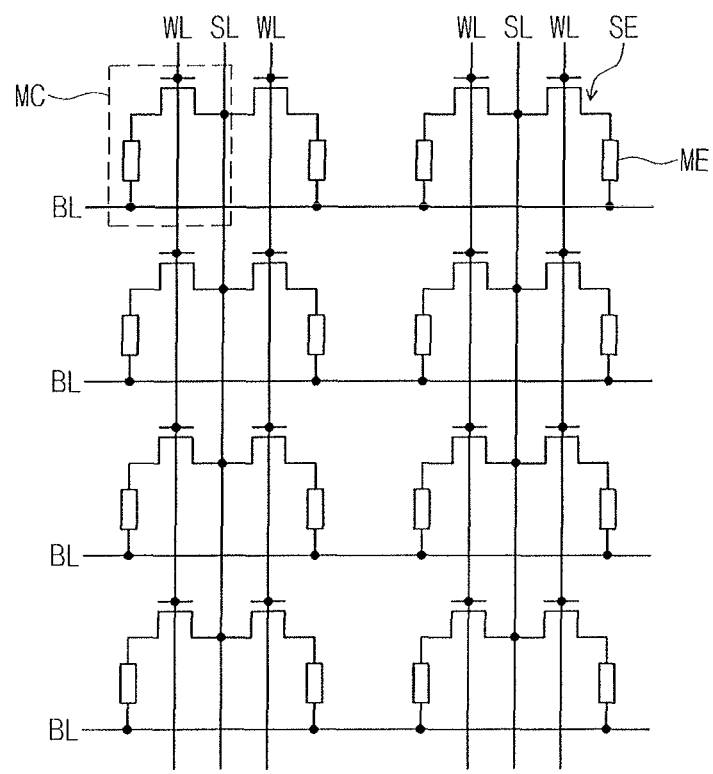
FIG. 1 illustrates a schematic circuit diagram of a cell array of a semiconductor memory device according to some example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

As used herein, the singular terms "a," "an" and "the" are intended to include the plural forms as well, unless the context clearly indicates otherwise. As used herein, the term "and/or" includes any and all combinations of one or more of the associated listed items.

In the drawing figures, the dimensions of layers and regions may be exaggerated for clarity of illustration. It will also be understood that when an element is referred to as being "connected" or "coupled" to another element, it may be directly connected or coupled to the other element or intervening elements may be present. Similarly, it will be understood that when an element such as a layer, region or substrate is referred to as being "on" another element, it can be directly on the other element or intervening elements may be present. In contrast, the term "directly" means that there are no intervening elements.

It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof. Additionally, the embodiments in the detailed description will be described with sectional views as ideal exemplary views. Accordingly, shapes of the exemplary views may be modified according to manufacturing techniques and/or allowable errors. Therefore, the embodiments are not limited to the specific shape illustrated in the exemplary views, but may include other shapes that may be created according to manufacturing processes.

Exemplary embodiments explained and illustrated herein include their complementary counterparts. The same reference numerals or the same reference designators denote the same elements throughout the specification.

FIG. 1 is a schematic circuit diagram illustrating a cell array of a semiconductor memory device according to some example embodiments.

Referring to FIG. 1, a plurality of unit memory cells MC may be two-dimensionally or three-dimensionally arranged. Each of the unit memory cells MC may be connected between a word line WL and a bit line BL which intersect each other. Each of the unit memory cells MC may include a memory element ME and a selection element SE. The selection element SE and the memory element ME may be electrically connected in series to each other.

The memory element ME may be connected between the bit line BL and the selection element SE, and the selection element SE may be connected between the memory element ME and a source line SL. The selection element SE may be controlled by the word line WL. The memory element ME may be a variable resistance element of which a resistance is changeable between two resistance states by an electrical pulse applied thereto. In some embodiments, the memory element ME may have a thin layer structure of which an electrical resistance is changed using spin torque transferred by a current passing therethrough. The memory element ME may have a thin layer structure showing a magnetoresistance property and may include at least one ferromagnetic material and/or at least one anti-ferromagnetic material.

The selection element SE may selectively control the supply of a current to the memory element ME on the base of a voltage of the word line WL. The selection element SE may be a diode, a PNP bipolar transistor, an NPN bipolar transistor, an NMOS field effect transistor, or a PMOS field effect transistor. For example, when the selection element SE is the bipolar transistor or MOS field effect transistor corresponding to a three-terminal element, the cell array may further include the source line SL connected to a source electrode of the transistor. The source line SL may be disposed between the word lines WL adjacent to each other, and two transistors may share one source line SL.

Figure 2:
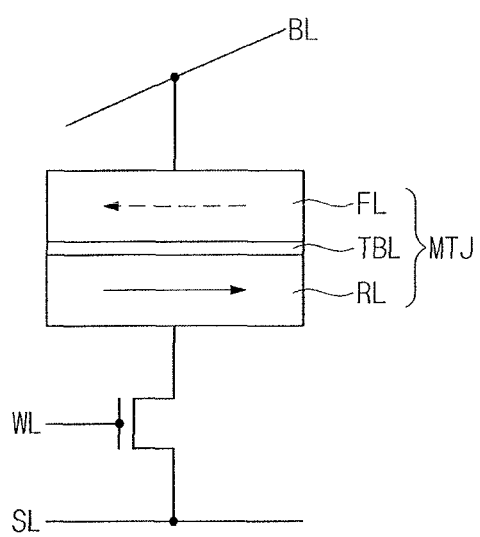
FIG. 2 illustrates a schematic circuit diagram of a unit memory cell of a semiconductor memory device according to some example embodiments.

FIG. 2 is a schematic circuit diagram illustrating a unit memory cell of a semiconductor memory device according to some example embodiments.

Referring to FIG. 2, a unit memory cell may include a magnetic memory element and a selection element. The magnetic memory element may include a magnetic tunnel junction MTJ including a plurality of magnetic layers FL and RL, and a tunnel barrier layer TBL disposed between the magnetic layers FL and RL. One RL of the magnetic layers may be a reference layer having a magnetization direction fixed regardless of an external magnetic field or spin transfer torque under a usual use environment. Another FL of the magnetic layers may be a free layer having a magnetization direction changeable by a program magnetic field or spin torque of a program current.

An electrical resistance value of the magnetic tunnel junction MTJ when the magnetization directions of the reference and free layers are anti-parallel to each other may be much greater than an electrical resistance value of the magnetic tunnel junction MTJ when the magnetization directions of the reference and free layers are parallel to each other. In other words, the electrical resistance value of the magnetic tunnel junction MTJ may be adjusted by changing the magnetization direction of the free layer. Thus, the unit memory cell may store data in the magnetic memory element by means of a difference between the electrical resistance values depending on the magnetization directions.

Figure 3:
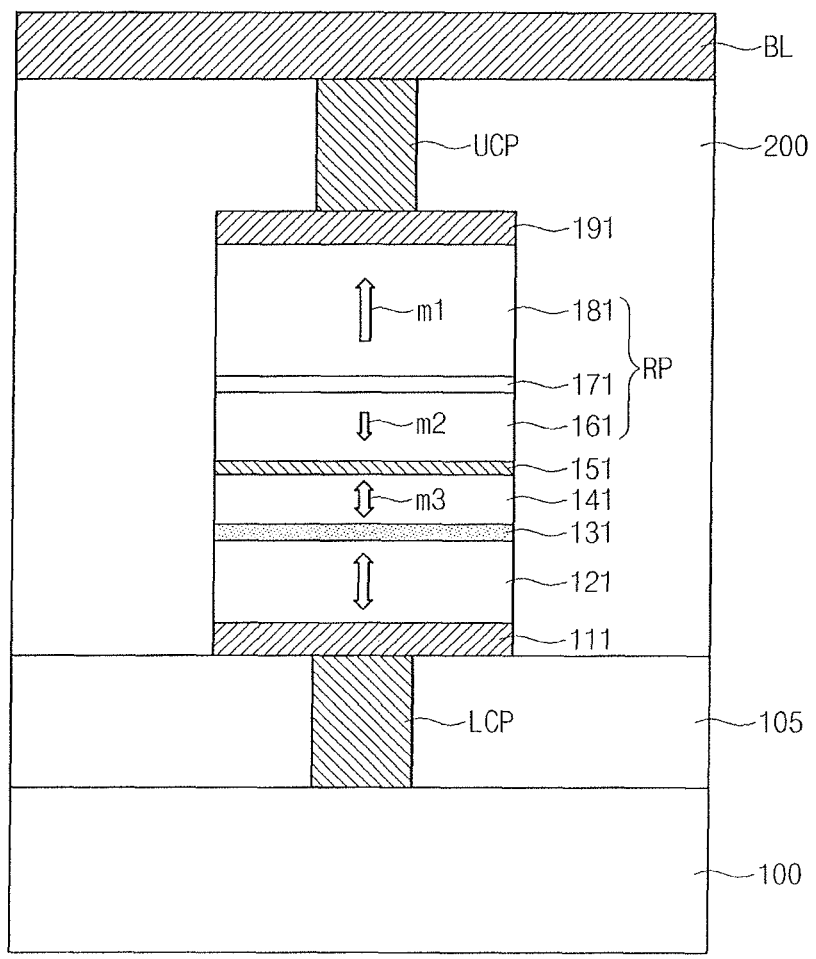
FIG. 3 illustrates a cross-sectional view of a semiconductor memory device according to some example embodiments.
Figure 4A:
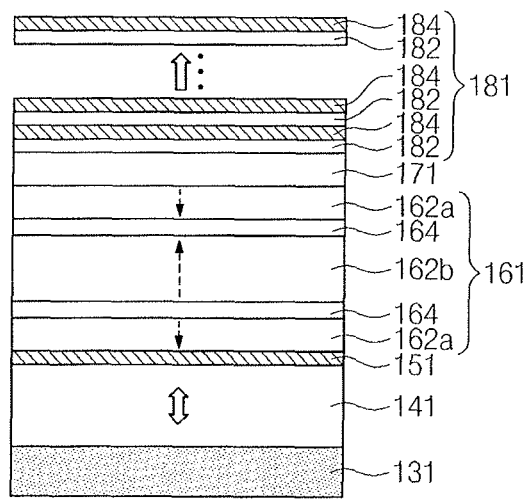
FIGS. 4A and 4B illustrate cross-sectional views of reference magnetic patterns of semiconductor memory devices according to some example embodiments.
Figure 4B:
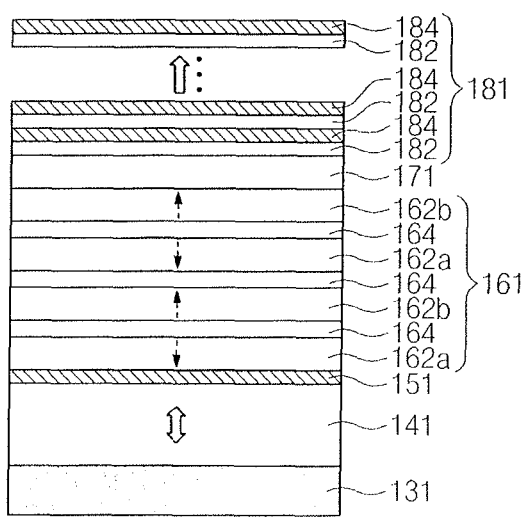

FIG. 3 is a cross-sectional view illustrating a semiconductor memory device according to some example embodiments. FIGS. 4A and 4B are cross-sectional views illustrating reference magnetic patterns of semiconductor memory devices according to some example embodiments.

Referring to FIG. 3, a lower interlayer insulating layer 105 may be disposed on a substrate 100. The substrate 100 may be a semiconductor substrate, e.g., a silicon substrate, a germanium substrate, or a silicon-germanium substrate. The lower interlayer insulating layer 105 may include at least one of, e.g., a silicon oxide layer, a silicon nitride layer, or a silicon oxynitride layer.

According to some example embodiments, a selection element (not shown) may be formed on the substrate 100, and the lower interlayer insulating layer 105 may cover the selection element. The selection element may be a PN diode or a field effect transistor.

A lower contact plug LCP may penetrate the lower interlayer insulating layer 105. The lower contact plug LCP may be electrically connected to one terminal of the selection element. The lower contact plug LCP may include at least one of, e.g., a doped semiconductor material (e.g., doped silicon), a metal (e.g., tungsten, titanium, and/or tantalum), a conductive metal nitride (e.g., titanium nitride, tantalum nitride, and/or tungsten nitride), or a metal-semiconductor compound (e.g., a metal silicide).

A magnetic tunnel junction pattern may be disposed on the lower interlayer insulating layer 105 and may be electrically connected to the lower contact plug LCP. The magnetic tunnel junction pattern may include a free magnetic pattern 121, a reference magnetic pattern RP, and a tunnel barrier pattern 131 between the free magnetic pattern 121 and the reference magnetic pattern RP. In addition, the magnetic tunnel junction pattern may further include a bottom electrode pattern 111 disposed between the lower contact plug LCP and the free magnetic pattern 121, and a top electrode pattern 191 disposed between the reference magnetic pattern RP and an upper contact plug UCP.

The reference magnetic pattern RP may have a magnetization direction fixed in one direction. By a program operation, a magnetization direction of the free magnetic pattern 121 may be changed to be parallel or anti-parallel to the fixed magnetization direction of the reference magnetic pattern RP. In some embodiments, the magnetization directions of the reference and free magnetic patterns RP and 121 may be substantially perpendicular to an interface between the tunnel barrier pattern 131 and the free magnetic pattern 121. In other words, each of the reference and free magnetic patterns RP and 121 may include a magnetic material having perpendicular magnetic anisotropy. The magnetization direction of the free magnetic pattern 121 may be changed by a spin torque transfer (STT) program operation. In other words, the magnetization direction of the free magnetic pattern 121 may be changed using spin torque of electrons included in a program current.

An upper interlayer insulating layer 200 may be disposed on the lower interlayer insulating layer 105 to cover the magnetic tunnel junction pattern. The upper contact plug UCP may penetrate the upper interlayer insulating layer 200 so as to be connected to the top electrode pattern 191. For example, the upper contact plug UCP may include at least one of a metal (e.g., tungsten, titanium, and/or tantalum) or a conductive metal nitride (e.g., titanium nitride, tantalum nitride, and/or tungsten nitride).

An interconnection BL may be disposed on the upper interlayer insulating layer 200 so as to be connected to the upper contact plug UCP. In some embodiments, the interconnection BL may correspond to the bit line illustrated in FIGS. 1 and 2. For example, the interconnection BL may include at least one of a metal (e.g., tungsten, titanium, and/or tantalum) or a conductive metal nitride (e.g., titanium nitride, tantalum nitride, and/or tungsten nitride).

According to some example embodiments, the bottom electrode pattern 111 may be disposed on the lower interlayer insulating layer 105 so as to be in contact with the lower contact plug LCP and a bottom surface of the free magnetic pattern 121. The top electrode pattern 191 may be in contact with a top surface of the reference magnetic pattern RP. For example, each of the bottom and top electrode patterns 111 and 191 may include at least one of a metal (e.g., tungsten, titanium, and/or tantalum) or a conductive metal nitride (e.g., titanium nitride, tantalum nitride, and/or tungsten nitride).

In some example embodiments, the bottom electrode pattern 111 may include a seed pattern (not shown). The seed pattern may be formed of a conductive material capable of being used as a seed of the free magnetic pattern 121. In some embodiments, the seed pattern may include a conductive material of which a crystal structure is similar to that of the free magnetic pattern 121. For example, when the free magnetic pattern 121 has a body-centered cubic (BCC) crystal structure, the seed pattern may include a conductive material having a sodium chloride crystal structure, e.g., titanium nitride or tantalum nitride.

The free magnetic pattern 121 may include a magnetic material capable of obtaining a high tunneling magnetoresistance ratio when it is in contact, e.g., with the tunnel barrier pattern 131. In addition, the free magnetic pattern 121 may include a magnetic material capable of inducing interfacial perpendicular magnetic anisotropy (i-PMA) at the interface between the tunnel barrier pattern 131 and the free magnetic pattern 121. The free magnetic pattern 121 may have a changeable magnetization direction.

For example, the free magnetic pattern 121 may include at least one of a perpendicular magnetic material (e.g., CoFeB, CoFeTb, CoFeGd, or CoFeDy), a perpendicular magnetic material having a $L1_0$ structure, CoPt having a hexagonal close packed (HCP) lattice structure, or any alloy thereof. In some embodiments, the free magnetic pattern 121 may include cobalt-iron-boron (CoFeB).

The free magnetic pattern 121 may have a similar crystal structure to the tunnel barrier pattern 131. For example, when the tunnel barrier pattern 131 has a sodium chloride (NaCl) crystal structure, the free magnetic pattern 121 may have a magnetic material having a BCC crystal structure of which lattice arrangement is similar to that of the NaCl crystal structure.

The tunnel barrier pattern 131 may have a thickness smaller than a spin diffusion distance. The tunnel barrier pattern 131 may include an insulating material. The tunnel barrier pattern 131 may be in contact with the free magnetic pattern 121 and may have a similar crystal structure to the free magnetic pattern 121. For example, when the free magnetic pattern 121 has the BCC crystal structure, the tunnel barrier pattern 131 may include an insulating material having the NaCl crystal structure. As described above, since the crystal structure of the tunnel barrier pattern 131 is matched with the crystal structure of the free magnetic pattern 121 at the interface between the tunnel barrier pattern 131 and the free magnetic pattern 121, a tunneling magnetoresistance ratio (TMR) of the magnetic tunnel junction pattern may be improved.

The tunnel barrier pattern 131 may include at least one of magnesium oxide, titanium oxide, aluminum oxide, magnesium-zinc oxide, or magnesium-boron oxide. For example, the tunnel barrier pattern 131 may be a magnesium oxide (MgO) layer having the NaCl crystal structure. Alternatively, the tunnel barrier pattern 131 may include a plurality of layers.

In some example embodiments, the reference magnetic pattern RP may have a synthetic anti-ferromagnetic (SAF) structure. For example, the reference magnetic pattern RP may include a first pinned pattern 161, a second pinned pattern 181, and an exchange coupling pattern 171 disposed between the first and second pinned patterns 161 and 181.

The first pinned pattern 161 may be disposed between the tunnel barrier pattern 131 and the exchange coupling pattern 171. In other words, the free magnetic pattern 121 may be more adjacent to the first pinned pattern 161 than to the second pinned 181. The first pinned pattern 161 may include a magnetic material and may have a different crystal structure from the free magnetic pattern 121. A magnetization direction of the first pinned pattern 161 may be pinned by the second pinned pattern 181 and may be substantially perpendicular to the interface between the tunnel barrier pattern 131 and the free magnetic pattern 121. The magnetization direction of the first pinned pattern 161 may be coupled to the magnetization direction of the second pinned pattern 181 by the exchange coupling pattern 171 in such a way that the magnetization directions of the first and second pinned patterns 161 and 181 are anti-parallel to each other. In some embodiments, a magnitude (or strength) of a magnetic moment m2 of the first pinned pattern 161 adjacent to the free magnetic pattern 121 may be smaller than a magnitude (or strength) of a magnetic moment m1 of the second pinned pattern 181.

Referring to FIGS. 4A and 4B, the first pinned pattern 161 may include first ferromagnetic patterns 162a and 162b and first non-magnetic patterns 164 which are alternately stacked. In the first pinned pattern 161, the first non-magnetic patterns 164 may include a non-magnetic material having an anti-ferromagnetic coupling property. In other words, the first non-magnetic patterns 164 may correspond to anti-ferromagnetic exchange coupling patterns. Thus, magnetic moments of the first ferromagnetic patterns 162a and 162b may be coupled in anti-parallel to each other by the first non-magnetic patterns 164. In other words, each of the first non-magnetic patterns 164 may cancel or offset at least portions of the magnetic moments of the first ferromagnetic patterns 162a and 162b adjacent to each other.

For example, the first ferromagnetic patterns 162a and 162b may include at least one of, e.g., iron (Fe), cobalt (Co), or nickel (Ni). The first non-magnetic patterns 164 may include at least one of, e.g., chromium (Cr), platinum (Pt), palladium (Pd), iridium (Ir), ruthenium (Ru), rhodium (Rh), osmium (Os), rhenium (Re), gold (Au), or copper (Cu). In some embodiments, the first ferromagnetic patterns 162a and 162b may include cobalt (Co), and the first non-magnetic patterns 164 may include iridium (Ir) or ruthenium (Ru).

According to some example embodiments illustrated in FIG. 4A, the first pinned pattern 161 may include an odd number of the first ferromagnetic patterns 162a and 162b, and an even number of the first non-magnetic patterns 164. The first ferromagnetic patterns 162a and 162b and the first non-magnetic patterns 164 may be alternately stacked.

Odd-numbered first ferromagnetic patterns 162a of the first ferromagnetic patterns may have magnetization directions anti-parallel to the magnetization direction of the second pinned pattern 181, and even-numbered first ferromagnetic patterns 162b of the first ferromagnetic patterns may have magnetization directions parallel to the magnetization direction of the second pinned pattern 181 by the first non-magnetic patterns 164 having the anti-ferromagnetic coupling property. In other words, the odd-numbered first ferromagnetic patterns 162a may be coupled to the even-numbered first ferromagnetic patterns 162b by the first non-magnetic patterns 164 in such a way that the magnetization directions (or magnetic moments) of the odd-numbered first ferromagnetic patterns 162a are anti-parallel to the magnetization directions of the even-numbered first ferromagnetic patterns 162b. In addition, thicknesses of the odd-numbered first ferromagnetic patterns 162a may be smaller than those of the even-numbered first ferromagnetic patterns 162b, e.g., along a direction normal to the substrate 100. Thicknesses of the first non-magnetic patterns 164 may be substantially equal to each other, e.g., a thickness of each of the first non-magnetic patterns 164 may be smaller than that of an adjacent odd-numbered first ferromagnetic pattern 162a.

In some example embodiments, magnitudes (or strengths) of the magnetic moments of the odd-numbered first ferromagnetic patterns 162a may be smaller than those of the magnetic moments of the even-numbered first ferromagnetic patterns 162b. Here, since the magnetic moments of the first ferromagnetic patterns 162a and 162b adjacent to each other are coupled in anti-parallel to each other by a first non-magnetic pattern 164 disposed therebetween, at least a portion of the magnetic moment of one of the adjacent first ferromagnetic patterns 162a and 162b may cancel at least a portion of the magnetic moment of the other of the adjacent first ferromagnetic patterns 162a and 162b. As a result, a net magnetic moment of the first pinned pattern 161 may be reduced.

According to some example embodiments illustrated in FIG. 4B, the first pinned pattern 161 may include an even number of the first ferromagnetic patterns 162a and 162b and an even number of the first non-magnetic patterns 164, and the first ferromagnetic patterns 162a and 162b and the first non-magnetic patterns 164 may be alternately stacked. Here, thicknesses of the first ferromagnetic patterns 162a and 162b may be substantially equal to each other, and thicknesses of the first non-magnetic patterns 164 may be substantially equal to each other e.g., a thicknesses of the first non-magnetic patterns 164 may be smaller than those of the first ferromagnetic patterns 162a and 162b.

Odd-numbered first ferromagnetic patterns 162a of the first ferromagnetic patterns may have magnetization directions anti-parallel to the magnetization direction of the second pinned pattern 181, and even-numbered first ferromagnetic patterns 162b of the first ferromagnetic patterns may have magnetization directions parallel to the magnetization direction of the second pinned pattern 181 by the first non-magnetic patterns 164 having the anti-ferromagnetic coupling property. In other words, the odd-numbered first ferromagnetic patterns 162a may be coupled to the even-numbered first ferromagnetic patterns 162b by the first non-magnetic patterns 164 in such a way that the magnetization directions (or magnetic moments) of the odd-numbered first ferromagnetic patterns 162a are anti-parallel to the magnetization directions (or magnetic moments) of the even-numbered first ferromagnetic patterns 162b.

In some example embodiments illustrated in FIG. 4B, magnitudes (or strengths) of the magnetic moments of the odd-numbered first ferromagnetic patterns 162a may be substantially equal to those of the magnetic moments of the even-numbered first ferromagnetic patterns 162b. Here, since the magnetic moments of the first ferromagnetic patterns 162a and 162b adjacent to each other are coupled in anti-parallel to each other by the first non-magnetic pattern 164 disposed therebetween, the magnetic moment of one of the adjacent first ferromagnetic patterns 162a and 162b may cancel or offset the magnetic moment of the other of the adjacent first ferromagnetic patterns 162a and 162b. As a result, a net magnetic moment of the first pinned pattern 161 may be reduced.

In some example embodiments, the first non-magnetic patterns 164 of the first pinned pattern 161 may include iridium (Ir) of which an inter-diffusion or intermixing property is small at a high temperature of about 400 degrees Celsius or more. Thus, perpendicular anisotropy of the first pinned pattern 161 including the first non-magnetic patterns 164 may be maintained during a process performed at a high temperature of about 400 degrees Celsius or more. In other words, a heat-resistance property of the first pinned pattern 161 may be improved.

The second pinned pattern 181 may be relatively far away from the free magnetic pattern 121 as compared with the first pinned pattern 161. In other words, a distance between the second pinned pattern 181 and the free magnetic pattern 121 may be greater than a distance between the first pinned pattern 161 and the free magnetic pattern 121. In some embodiments, the magnetization direction of the second pinned pattern 181 may be opposite to the magnetization direction of the first pinned pattern 161, and the magnitude (or strength) of the magnetic moment m1 of the second pinned pattern 181 may be greater than the magnitude (or strength) of the magnetic moment m2 of the first pinned pattern 161. The second pinned pattern 181 far away from the free magnetic pattern 121 may include a perpendicular magnetic material or perpendicular magnetic structure having a magnetization direction substantially perpendicular to the interface between the tunnel barrier pattern 131 and the free magnetic pattern 121.

In some example embodiments, as illustrated in FIGS. 4A and 4B, the second pinned pattern 181 may include second ferromagnetic patterns 182 and second non-magnetic patterns 184 which are alternately and repeatedly stacked. For example, the second ferromagnetic patterns 182 may include at least one of, e.g., iron (Fe), cobalt (Co), or nickel (Ni), and the second non-magnetic patterns 184 may include at least one of, e.g., chromium (Cr), platinum (Pt), palladium (Pd), iridium (Ir), ruthenium (Ru), rhodium (Rh), osmium (Os), rhenium (Re), gold (Au), or copper (Cu).

In some example embodiments, the second ferromagnetic patterns 182 may include the same ferromagnetic material as the first ferromagnetic patterns 162a and 162b, and the second non-magnetic patterns 184 may include a different non-magnetic material from the first non-magnetic patterns 164. In some example embodiments, the second ferromagnetic patterns 182 may include cobalt (Co), and the second non-magnetic patterns 184 may include platinum (Pt) or palladium (Pd). For example, the second pinned pattern 181 may include at least one of, e.g., (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n, where "n" denotes the number of bilayers. In some embodiments, the number of the second ferromagnetic patterns 182 included in the second pinned pattern 181 may be more than the number of the first ferromagnetic patterns 162a and 162b included in the first pinned pattern 161, e.g., a total number of the stacked second ferromagnetic patterns 182 in the second pinned pattern 181 may be greater than a total number of the first ferromagnetic patterns 162a and 162b stacked in the first pinned pattern 161. In addition, the number of the second non-magnetic patterns 184 included in the second pinned pattern 181 may be more than the number of the first non-magnetic patterns 164 included in the first pinned pattern 161 e.g., a total number of the stacked second non-magnetic patterns 184 in the second pinned pattern 181 may be greater than a total number of the non-magnetic patterns 164 stacked in the first pinned pattern 161. In some embodiments, thicknesses of the second ferromagnetic patterns 182 of the second pinned pattern 181 may be substantially equal to each other.

In some example embodiments, to reduce a saturation magnetization (Ms) of the second pinned pattern 181, the second pinned pattern 181 may have a $L1_1$ superlattice structure. For example, the second pinned pattern 181 may include a (Co/Pt)n $L1_1$ superlattice structure, where "n" is a natural number. Alternatively, the second pinned pattern 181 may include at least one of a perpendicular magnetic material (e.g., CoFeTb, CoFeGd, or CoFeDy), a perpendicular magnetic material having the $L1_0$ structure, CoPt having a face-centered cubic (FCC) structure, or any alloy thereof. For example, when the second pinned pattern 181 includes a CoPt alloy, the CoPt alloy may be doped with boron (B) to reduce a saturation magnetization of the CoPt alloy.

The exchange coupling pattern 171 may couple the first pinned pattern 161 and the second pinned pattern 181 to each other in such a way that the magnetization direction of the first pinned pattern 161 is anti-parallel to the magnetization direction of the second pinned pattern 181. The exchange coupling pattern 171 may couple the first and second pinned patterns 161 and 181 to each other by Ruderman-Klttel-Kasuya-Yosida (RKKY) interaction. For example, the exchange coupling pattern 171 may include at least one of, e.g., ruthenium (Ru), iridium (Ir), chromium (Cr), or rhodium (Rh).

The magnetic moment m2 of the first pinned pattern 161 and a magnetic moment m3 of a polarization enhancement magnetic pattern 141 may cancel the magnetic moment m1 of the second pinned pattern 181 by the exchange coupling pattern 171. Thus, a net magnetic field of the reference magnetic pattern RP may be minimized. As a result, it is possible to minimize an influence of a magnetic field, generated from the reference magnetic pattern RP, upon the free magnetic pattern 121.

The polarization enhancement magnetic pattern 141 may be disposed between the tunnel barrier pattern 131 and the first pinned pattern 161 of the reference magnetic pattern RP. The polarization enhancement magnetic pattern 141 may be in contact, e.g., direct contact, with the tunnel barrier pattern 131.

The polarization enhancement magnetic pattern 141 may include a magnetic material capable of obtaining a high tunneling magnetoresistance ratio when it is in contact with the tunnel barrier pattern 131. In addition, the polarization enhancement magnetic pattern 141 may include a magnetic material capable of inducing interfacial perpendicular magnetic anisotropy (i-PMA) at an interface between the tunnel barrier pattern 131 and the polarization enhancement magnetic pattern 141. The polarization enhancement magnetic pattern 141 may have a changeable magnetization direction. In some example embodiments, a magnitude (or strength) of the magnetic moment m3 of the polarization enhancement magnetic pattern 141 may be greater than the magnitude (or strength) of the magnetic moment m2 of the first pinned pattern 161.

The polarization enhancement magnetic pattern 141 may have a similar crystal structure to the tunnel barrier pattern 131 and may have the same crystal structure as the free magnetic pattern 121. In addition, the crystal structure of the polarization enhancement magnetic pattern 141 may be different from that of the first pinned pattern 161. For example, the polarization enhancement magnetic pattern 141 may include a magnetic material having a BCC crystal structure or may include a magnetic material having the BCC crystal structure with a non-magnetic element.

In some example embodiments, the polarization enhancement magnetic pattern 141 may include a soft magnetic material. In addition, the polarization enhancement magnetic pattern 141 may have a low damping constant and a high spin polarization ratio. For example, the polarization enhancement magnetic pattern 141 may include at least one of, e.g., cobalt (Co), iron (Fe), or nickel (Ni). The polarization enhancement magnetic pattern 141 may further include at least one non-magnetic material of, e.g., boron (B), zinc (Zn), aluminum (Al), titanium (Ti), ruthenium (Ru), tantalum (Ta), silicon (Si), silver (Ag), gold (Au), copper (Cu), carbon (C), and nitrogen (N). In some embodiments, the polarization enhancement magnetic pattern 141 may include CoFe or NiFe and may further include boron (B). For example, the polarization enhancement magnetic pattern 141 may include cobalt-iron-boron (CoFeB). In addition, to reduce a saturation magnetization of the polarization enhancement magnetic pattern 141, the polarization enhancement magnetic pattern 141 may further include at least one of, e.g., titanium (Ti), aluminum (Al), silicon (Si), magnesium (Mg), tantalum (Ta), or silicon (Si).

An intervening pattern 151 may be disposed between the polarization enhancement magnetic pattern 141 and the first pinned pattern 161 of the reference magnetic pattern RP. The intervening pattern 151 may be in contact, e.g., direct contact, with the polarization enhancement magnetic pattern 141. The intervening pattern 151 may include a conductive material (e.g., a metal) capable of inducing interfacial perpendicular magnetic anisotropy (i-PMA) at an interface between the intervening pattern 151 and the polarization enhancement magnetic pattern 141. The intervening pattern 151 may have a thin thickness of about 2 Å to about 20 Å. The intervening pattern 151 may be formed of a non-magnetic material capable of coupling the polarization enhancement magnetic pattern 141 to the first ferromagnetic pattern 162a of the first pinned pattern 161. The intervening pattern 151 may include at least one of, e.g., Ta, Ru, Pd, Ti, Hf, Zr, Mg, Cr, W, Mo, Nb, Si, Y, MgO, RuO, CFBTa, any combination thereof, any alloy thereof, any oxide thereof, any nitride thereof, or any oxynitride thereof. For example, the intervening pattern 151 may include tungsten (W), molybdenum (Mo), or tantalum (Ta). The polarization enhancement magnetic pattern 141 may be anti-ferromagnetically or ferromagnetically strongly coupled to the first pinned pattern 161 by the intervening pattern 151.

In some embodiments, the intervening pattern 151 may be in contact, e.g., direct contact, with the first ferromagnetic pattern 162a (e.g., Co) of the first pinned pattern 161, and the magnetic moment m3 of the polarization enhancement magnetic pattern 141 may be coupled in parallel to the magnetic moment m2 of the first ferromagnetic pattern 162a by the intervening pattern 151. The first ferromagnetic pattern 162a may have a high perpendicular magnetic anisotropy, thereby improving perpendicular magnetic anisotropy of the polarization enhancement magnetic pattern 141 coupled to the first ferromagnetic pattern 162a. In addition, the magnetization direction of the polarization enhancement magnetic pattern 141 may be fixed by the first pinned pattern 161.

In addition, the intervening pattern 151 may include a material not having crystallographic texture or crystallographic orientation. In other words, grains of the intervening pattern 151 not having the crystallographic texture may have random orientation. For example, the intervening pattern 151 may include a metal material having an amorphous structure. The intervening pattern 151 may block a crystal mismatch between the polarization enhancement magnetic pattern 141 and the first pinned pattern 161. In other words, the intervening pattern 151 may block a crystal influence between the reference magnetic pattern RP and the polarization enhancement magnetic pattern 141, and thus the tunneling magnetoresistance ratio (TMR) of the magnetic tunnel junction pattern may be increased.

In some example embodiments, the intervening pattern 151 may have the same crystal structure as the polarization enhancement magnetic pattern 141. For example, the intervening pattern 151 may have a BCC crystal structure.

In some example embodiments, the intervening pattern 151 may have a single-layered structure or a multi-layered structure including a plurality of stacked layers. For example, the intervening pattern 151 may be formed of a single tungsten layer. In another example, the intervening pattern 151 may have a multi-layered structure of W/FeB/W, a multi-layered structure of Mo/FeB/W, a multi-layered structure of W/FeB/Mo, or a multi-layered structure of Mo/FeB/Mo.

Since the magnetic moment m3 of the polarization enhancement magnetic pattern 141 is coupled in parallel to the magnetic moment m2 of the first pinned pattern 161 by the intervening pattern 151, the magnetic moment m3 of the polarization enhancement magnetic pattern 141 may not be canceled by the magnetic moment m2 of the first pinned pattern 161, but may influence a switching operation of the free magnetic pattern 121. However, according to some embodiments, since the magnetization directions of the first ferromagnetic patterns 162a and 162b within the first pinned pattern 161 are coupled in anti-parallel to each other, the overall magnitude of the magnetic moment m2 of the first pinned pattern 161 may be reduced. Thus, the magnetic moment m3 of the polarization enhancement magnetic pattern 141 with the magnetic moment m2 of the first pinned pattern 161 may be canceled by the magnetic moment m1 of the second pinned pattern 181. In other words, a sum of the magnitudes of the magnetic moments m3 and m2 of the polarization enhancement magnetic pattern 141 and the first pinned pattern 161 may be substantially equal to the magnitude of the magnetic moment m1 of the second pinned pattern 181. Thus, it is possible to reduce or minimize a stray magnetic field of the polarization enhancement magnetic pattern 141 and the first and second pinned patterns 161 and 181. As a result, it is possible to reduce a phenomenon that a distribution of a switching field (Hc) of the free magnetic pattern 121 is shifted. This means that a switching characteristic of the magnetic tunnel junction pattern may be improved.

Figure 5:
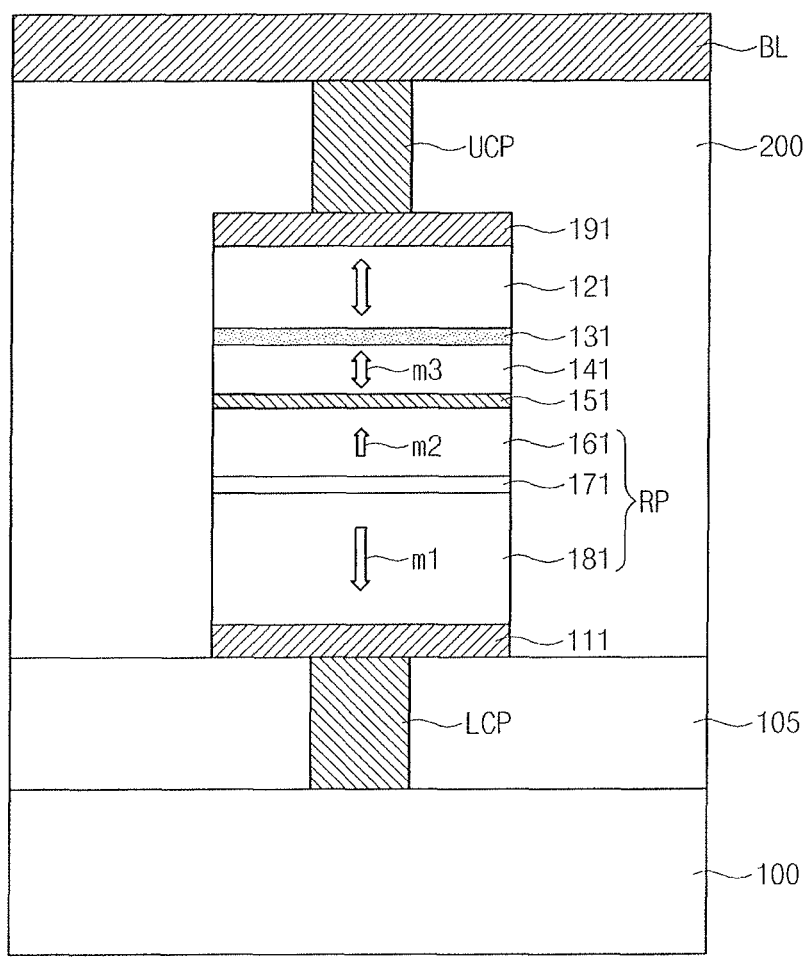
FIG. 5 illustrates a cross-sectional view o a semiconductor memory device according to some example embodiments.
Figure 6:
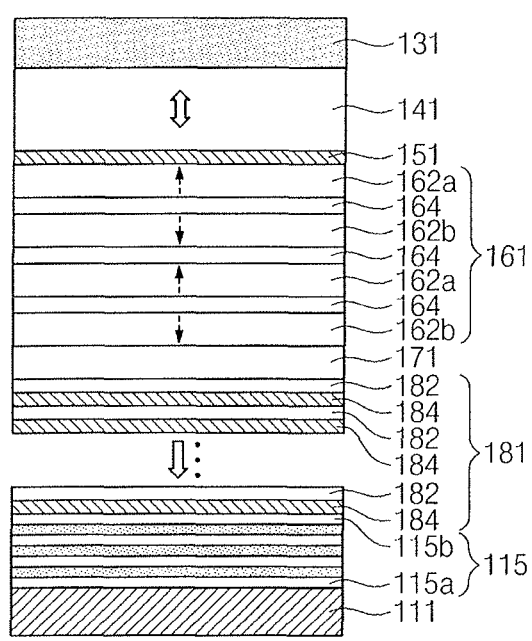
FIG. 6 illustrates a cross-sectional view of a reference magnetic pattern of a semiconductor memory device according to some example embodiments.

FIG. 5 is a cross-sectional view illustrating a semiconductor memory device according to some example embodiments. FIG. 6 is a cross-sectional view illustrating a reference magnetic pattern RP of a semiconductor memory device according to some example embodiments. In the present embodiment, descriptions of same technical features as those described previously with reference to the embodiments of FIGS. 3, 4A, and 4B will be omitted or mentioned briefly for the purpose of ease and convenience in explanation.

Referring to FIG. 5, a magnetic tunnel junction pattern may include the reference magnetic pattern RP disposed between the bottom electrode pattern 111 and the tunnel barrier pattern 131, and the free magnetic pattern 121 disposed between the top electrode pattern 191 and the tunnel barrier pattern 131. As described above, the reference magnetic pattern RP may have the synthetic anti-ferromagnetic (SAF) structure. In other words, the reference magnetic pattern RP may include the first and second pinned patterns 161 and 181, and the exchange coupling pattern 171 disposed between the first and second pinned patterns 161 and 181. In some embodiments, the first pinned pattern 161 may be adjacent to the free magnetic pattern 121, and the second pinned pattern 181 may be adjacent to the bottom electrode pattern 111. As illustrated in FIG. 6, the first pinned pattern 161 may include the first ferromagnetic patterns 162a and 162b and the first non-magnetic patterns 164 which are alternately stacked. The magnetic moments (or magnetization directions) of the first ferromagnetic patterns 162a and 162b may be coupled in anti-parallel to each other by the first non-magnetic patterns 164, and thus the magnetic moments of the first ferromagnetic patterns 162a and 162b may cancel each other.

In addition, the magnetic tunnel junction pattern may further include the polarization enhancement magnetic pattern 141 disposed between the first pinned pattern 161 and the tunnel barrier pattern 131, and the intervening pattern 151 disposed between the polarization enhancement magnetic pattern 141 and the first pinned pattern 161. The polarization enhancement magnetic pattern 141 may be in contact with a bottom surface of the tunnel barrier pattern 131, and the intervening pattern 151 may be in contact with the first ferromagnetic pattern 162a of the first pinned pattern 161.

As described above, the polarization enhancement magnetic pattern 141 may be in contact with the tunnel barrier pattern 131 and may have a similar crystal structure to the tunnel barrier pattern 131. The magnetic moment m3 of the polarization enhancement magnetic pattern 141 may be coupled in parallel to the magnetic moment m2 of the first pinned pattern 161 by the intervening pattern 151, and the magnetic moment m1 of the second pinned pattern 181 may be coupled in anti-parallel to the magnetic moments m2 and m3 of the first pinned pattern 161 and the polarization enhancement magnetic pattern 141 by the exchange coupling pattern 171. Here, the magnitude of the magnetic moment m2 of the first pinned pattern 161 may be smaller than that of the magnetic moment m3 of the polarization enhancement magnetic pattern 141, and a sum of the magnitudes of the magnetic moments m2 and m3 of the first pinned pattern 161 and the polarization enhancement magnetic pattern 141 may be substantially equal or similar to the magnitude of the magnetic moment m1 of the second pinned pattern 181.

Furthermore, the magnetic tunnel junction pattern 131 may further include a seed pattern 115 disposed between the bottom electrode pattern 111 and the second pinned pattern 181, as illustrated in FIG. 6. In some embodiments, the seed pattern 115 may function as a seed of the second pinned pattern 181. The seed pattern 115 may have a similar crystal structure to the second pinned pattern 181. The seed pattern 115 may include a metal material having low reactivity. For example, the seed pattern 115 may include at least one of, e.g., ruthenium (Ru), platinum (Pt), palladium (Pd), gold (Au), silver (Ag), copper (Cu), or aluminum (Al).

In some example embodiments, the seed pattern 115 may include first metal layers 115a and second metal layers 115b which are different from each other and are alternately stacked. For example, the seed pattern 115 may include ruthenium layers and iridium layers which are alternately stacked. In another example, the seed pattern 115 may have a single layered structure formed of iridium (Ir). As described above, in the case in which the second pinned pattern 181 is formed on the seed pattern 115, crystallizability of the second pinned pattern 181 may be improved, and thus a thickness of the second pinned pattern 181 may be reduced. In addition, the seed pattern 115 may include iridium (Ir) having the small inter-diffusion or intermixing property at a high temperature of about 400 degrees Celsius or more, thereby improving heat-resistance of the second pinned pattern 181 including a CoPt or CoPt alloy of a superlattice structure.

Figure 7:
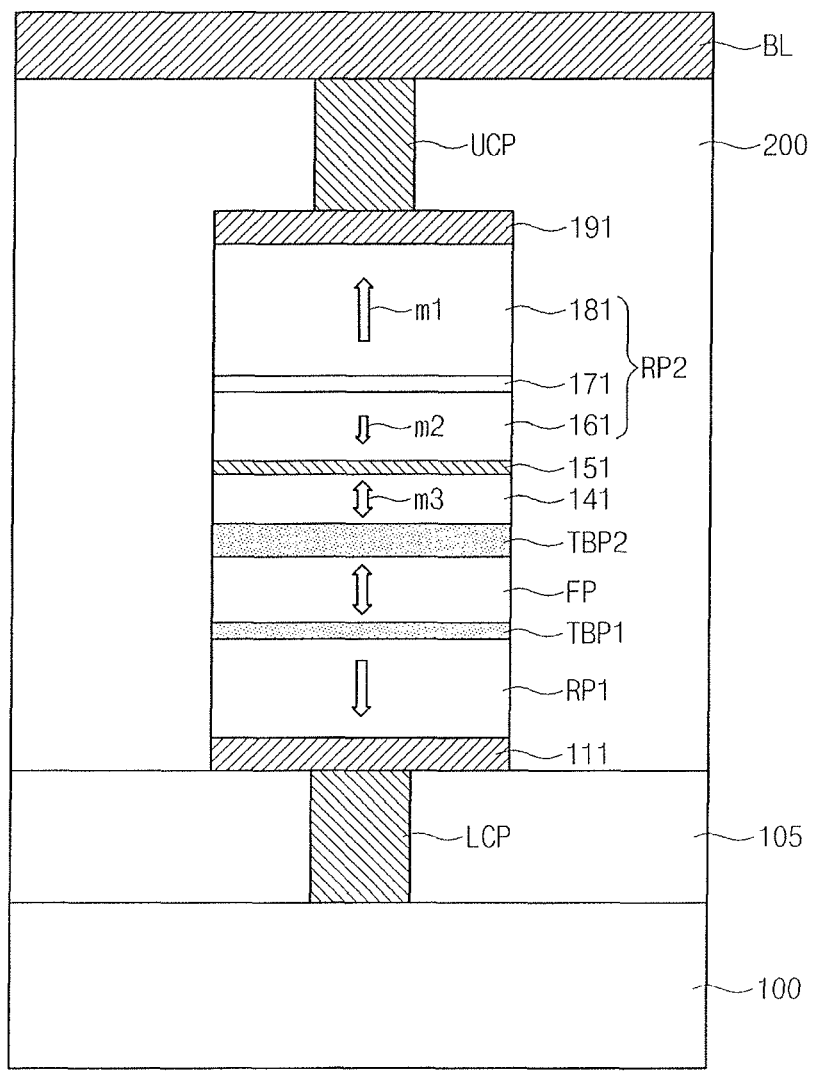
FIG. 7 illustrates a cross-sectional view of a reference magnetic pattern of a semiconductor memory device according to some example embodiments.

FIG. 7 is a cross-sectional view illustrating a reference magnetic pattern of a semiconductor memory device according to some example embodiments. Hereinafter, the descriptions of same technical features as described previously with reference to the embodiments of FIGS. 3, 4A, and 4B will be omitted or mentioned briefly for the purpose of ease and convenience in explanation.

Referring to FIG. 7, a magnetic tunnel junction pattern may include first and second reference magnetic patterns RP1 and RP2, a free magnetic pattern FP, and first and second tunnel barrier patterns TBP1 and TBP2. The first reference magnetic pattern RP1, the first tunnel barrier pattern TBP1, and the free magnetic pattern FP may constitute a first magnetic tunnel junction pattern. The second reference magnetic pattern RP2, and the second tunnel barrier pattern TBP2, and the free magnetic pattern FP may constitute a second magnetic tunnel junction pattern.

In some example embodiments, the first reference magnetic pattern RP1 may be disposed between the bottom electrode pattern 111 and the first tunnel barrier pattern TBP1. The first reference magnetic pattern RP1 may have a material and/or a structure which have a fixed magnetization direction substantially perpendicular to an interface between the first tunnel barrier pattern TBP1 and the first reference magnetic pattern RP1. For example, the first reference magnetic pattern RP1 may include at least one of, e.g., a perpendicular magnetic material (e.g., CoFeTb, CoFeGd, or CoFeDy), a perpendicular magnetic material having the $L1_0$ structure, CoPt having the HCP lattice structure, a perpendicular magnetic material having a $L1_1$ (superlattice) structure, or any alloy thereof.

The perpendicular magnetic material having the $L1_0$ structure may include at least one of, e.g., FePt having the $L1_0$ structure, FePd having the $L1_0$ structure, CoPd having the $L1_0$ structure, or CoPt having the $L1_0$ structure. For example, when the first reference magnetic pattern RP1 includes a CoPt alloy, the CoPt alloy may be doped with boron (B) to reduce the saturation magnetization of the CoPt alloy.

When the first reference magnetic pattern RP1 includes CoFeTb, a content of terbium (Tb) may be about 10% or more in the CoFeTb. Likewise, when the first reference magnetic pattern RP1 includes CoFeGd, a content of gadolinium (Gd) may be about 10% or more in the CoFeGd.

In some example embodiments, the first reference magnetic pattern RP1 may include a perpendicular magnetic structure that includes magnetic layers and non-magnetic layers alternately and repeatedly stacked. For example, the perpendicular magnetic structure may include at least one of, e.g., (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n, where "n" denotes the number of bilayers.

The first and second tunnel barrier patterns TBP1 and TBP2 may be in contact with the free magnetic pattern FP and may have thicknesses different from each other. For example, each of the first and second tunnel barrier patterns TBP1 and TBP2 may include at least one of, e.g., magnesium oxide (MgO), titanium oxide (TiO), aluminum oxide (AlO), magnesium-zinc oxide (MgZnO), or magnesium-boron oxide (MgBO).

The free magnetic pattern FP may be in direct contact with a top surface of the first tunnel barrier pattern TBP1 and a bottom surface of the second tunnel barrier pattern TBP2. The free magnetic pattern FP may have a changeable magnetization direction substantially perpendicular to a top surface of the substrate 100. The magnetization direction of the free magnetic pattern FP may be changeable to be parallel to anti-parallel to magnetization directions of the first and second reference magnetic patterns RP1 and RP2. The free magnetic pattern FP may be formed of a magnetic material having perpendicular magnetic anisotropy. For example, the free magnetic pattern FP may include at least one of a perpendicular magnetic material (e.g., CoFeTb, CoFeGd, or CoFeDy), a perpendicular magnetic material having the $L1_0$ structure, CoPt having the HCP lattice structure, or any alloy thereof.

The second reference magnetic pattern RP2 may include the first and second pinned patterns 161 and 181 and the exchange coupling pattern 171 disposed between the first and second pinned patterns 161 and 181, as described above. Here, the first pinned pattern 161 may include the first ferromagnetic patterns (162a and 162b of FIG. 4A or 4B) and the first non-magnetic patterns (164 of FIG. 4A or 4B) coupling the first ferromagnetic patterns 162a and 162b to each other in such a way that the magnetic moments of the first ferromagnetic patterns 162a and 162b are anti-parallel to each other, as described above. In addition, the polarization enhancement magnetic pattern 141 may be disposed between the second tunnel barrier pattern TBP2 and the first pinned pattern 161, and the intervening pattern 151 may be disposed between the polarization enhancement magnetic pattern 141 and the first pinned pattern 161. The polarization enhancement magnetic pattern 141 may be in contact with the second tunnel barrier pattern TBP2, and the magnetic moment m3 of the polarization enhancement magnetic pattern 141 may be coupled in parallel to the magnetic moment m2 of the first pinned pattern 161 by the intervening pattern 151. The magnetic moment m1 of the second pinned pattern 181 may be coupled in anti-parallel to the magnetic moments m2 and m3 of the first pinned pattern 161 and the polarization enhancement magnetic pattern 141 by the exchange coupling pattern 171. Here, the magnitude of the magnetic moment m2 of the first pinned pattern 161 may be smaller than the magnitude of the magnetic moment m3 of the polarization enhancement magnetic pattern 141, and a sum of the magnitudes of the magnetic moments m2 and m3 of the first pinned pattern 161 and the polarization enhancement magnetic pattern 141 may be substantially equal to or similar to the magnitude of the magnetic moment m1 of the second pinned pattern 181.

Figure 8:
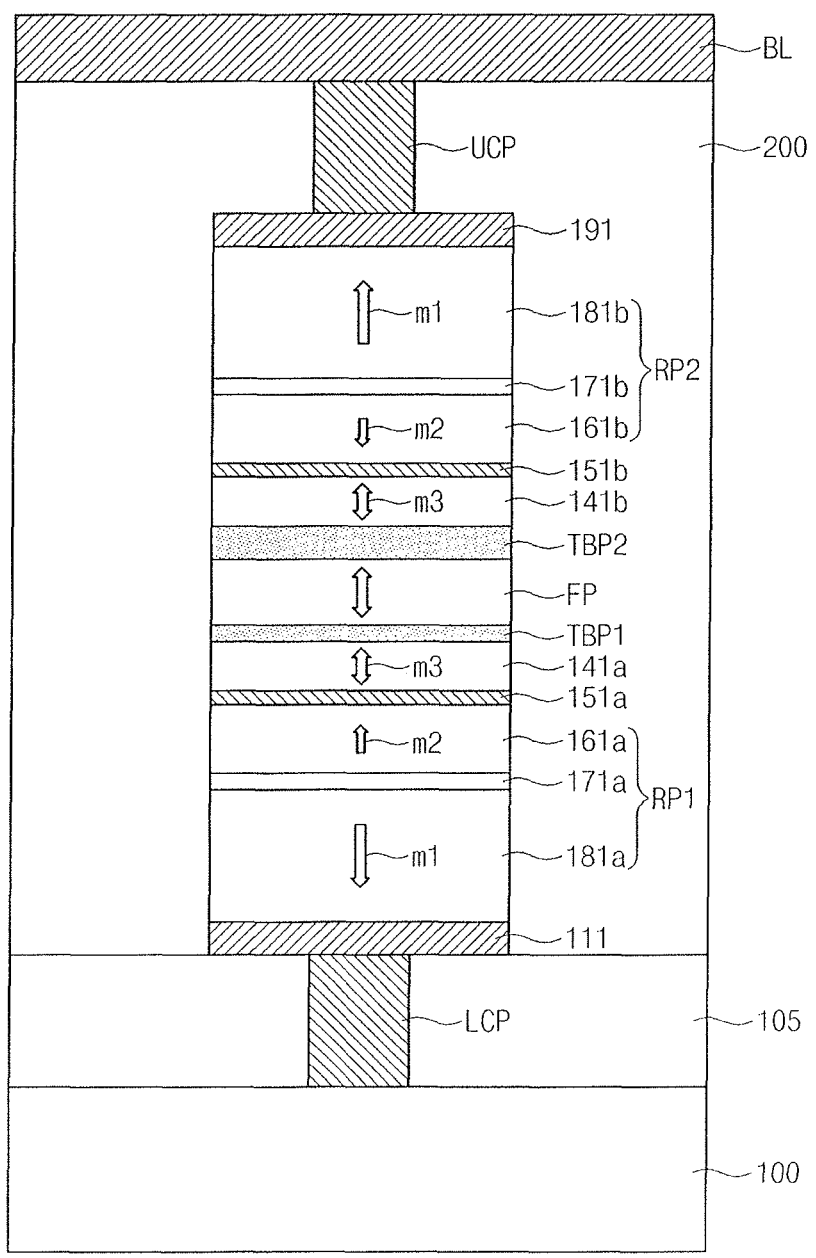
FIG. 8 illustrates a cross-sectional view of a semiconductor memory device according to some example embodiments.

FIG. 8 is a cross-sectional view illustrating a semiconductor memory device according to some example embodiments. Hereinafter, descriptions of same technical features as those described previously with reference to the embodiment of FIG. 7 will be omitted or mentioned briefly for the purpose of ease and convenience in explanation.

Referring to FIG. 8, a magnetic tunnel junction pattern may include first and second reference magnetic patterns RP1 and RP2, the free magnetic pattern FP, and the first and second tunnel barrier patterns TBP1 and TBP2. The first reference magnetic pattern RP1 may include first and second pinned patterns 161a and 181a, and an exchange coupling pattern 171a disposed between the first and second pinned patterns 161a and 181a. The second reference magnetic pattern RP2 may include first and second pinned patterns 161b and 181b, and an exchange coupling pattern 171b disposed between the first and second pinned patterns 161b and 181b. In addition, the magnetic tunnel junction pattern may further include a first polarization enhancement magnetic pattern 141a disposed between the first tunnel barrier pattern TBP1 and the first pinned pattern 161a of the first reference magnetic pattern RP1, and a first intervening pattern 151a disposed between the first polarization enhancement magnetic pattern 141a and the first pinned pattern 161a of the first reference magnetic pattern RP1. Furthermore, the magnetic tunnel junction pattern may further include a second polarization enhancement magnetic pattern 141b disposed between the second tunnel barrier pattern TBP2 and the first pinned pattern 161b of the second reference magnetic pattern RP2, and a second intervening pattern 151b disposed between the second polarization enhancement magnetic pattern 141b and the first pinned pattern 161b of the second reference magnetic pattern RP2.

Each of the first pinned patterns 161a and 161b of the first and second reference magnetic patterns RP1 and RP2 may include the first ferromagnetic patterns and the first non-magnetic patterns coupling the first ferromagnetic patterns to each other in such a way that the magnetic moments of the first ferromagnetic patterns are anti-parallel to each other, as described above.

A method of manufacturing a semiconductor memory device according to some embodiments will be described hereinafter with reference to FIGS. 9 to 17.

Figure 9:
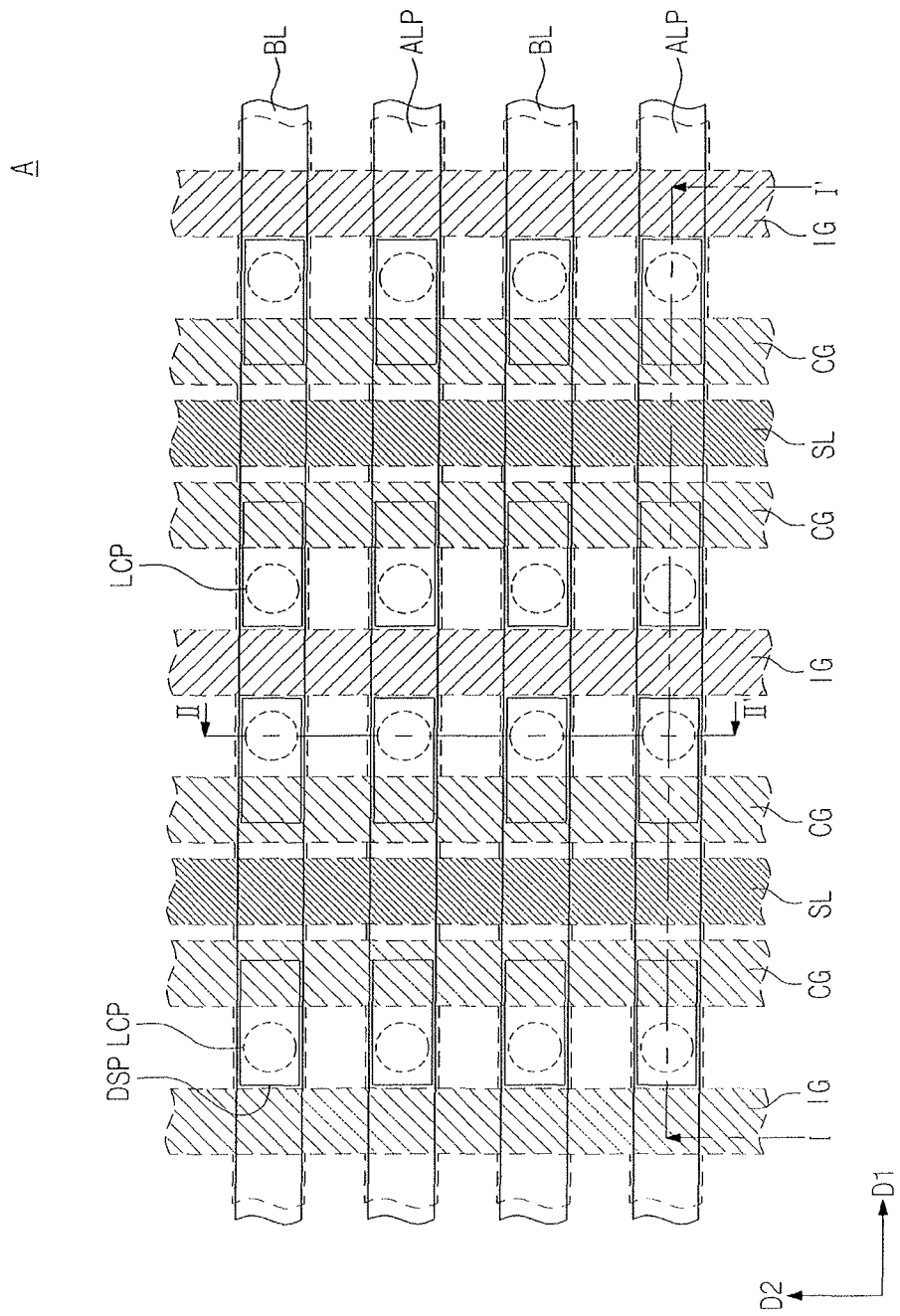
FIG. 9 illustrates a plan view of a semiconductor memory device according to some example embodiments.
Figure 10:
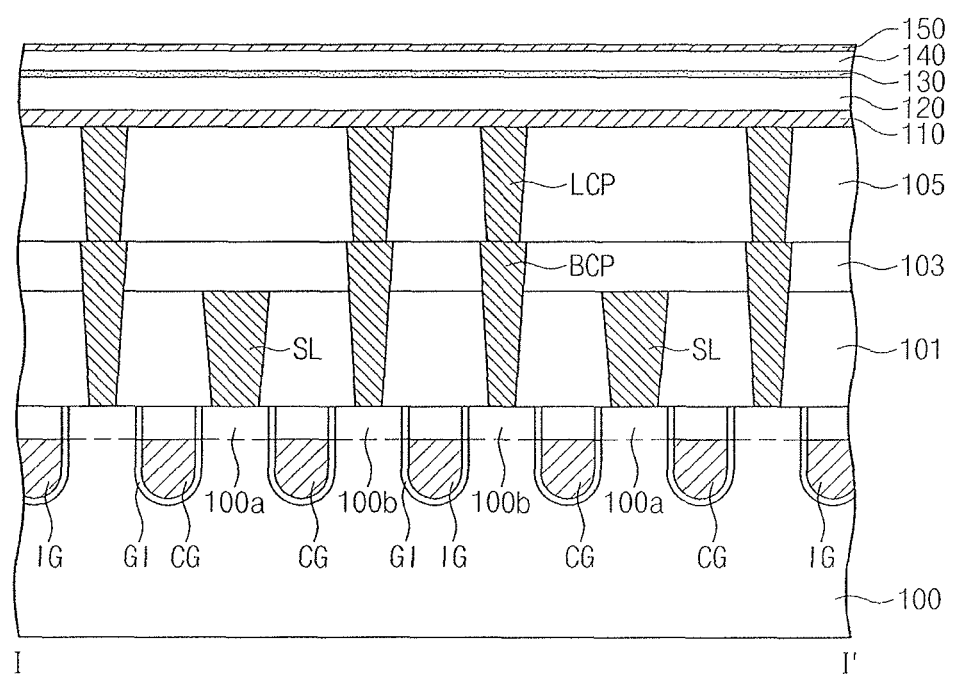
FIGS. 10 to 14 illustrate cross-sectional views taken along line I-I' of FIG. 9 to illustrate stages in a method of manufacturing a semiconductor memory device, according to some example embodiments.
Figure 15:
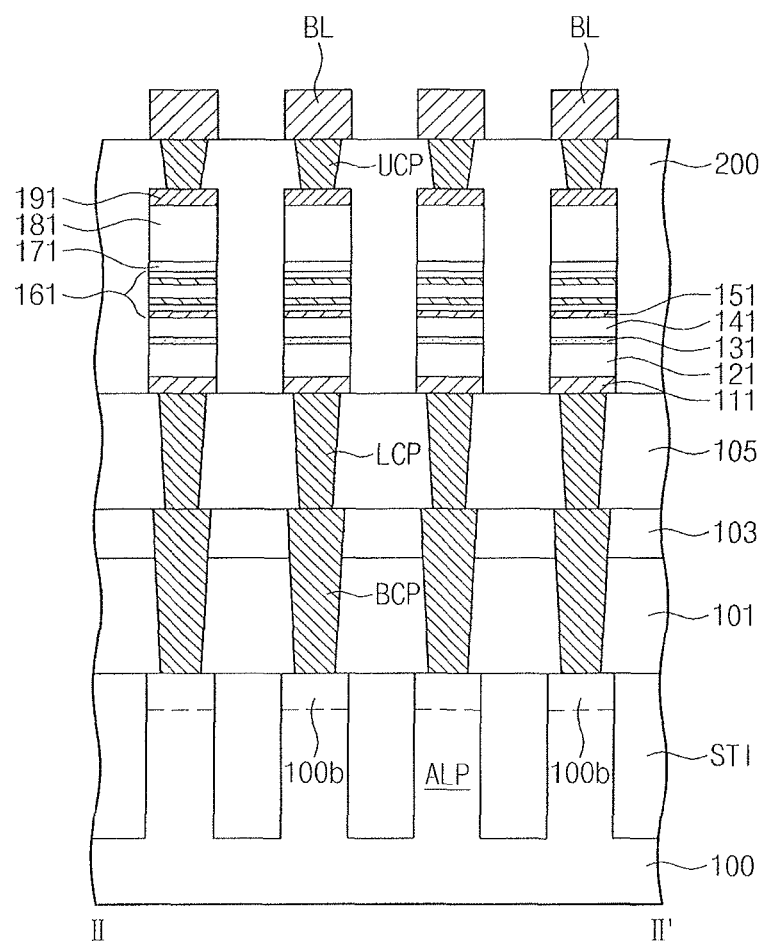
FIG. 15 illustrates a cross-sectional view taken along line II-II' of FIG. 9 to illustrate a semiconductor memory device according to some example embodiments.
Figure 16:
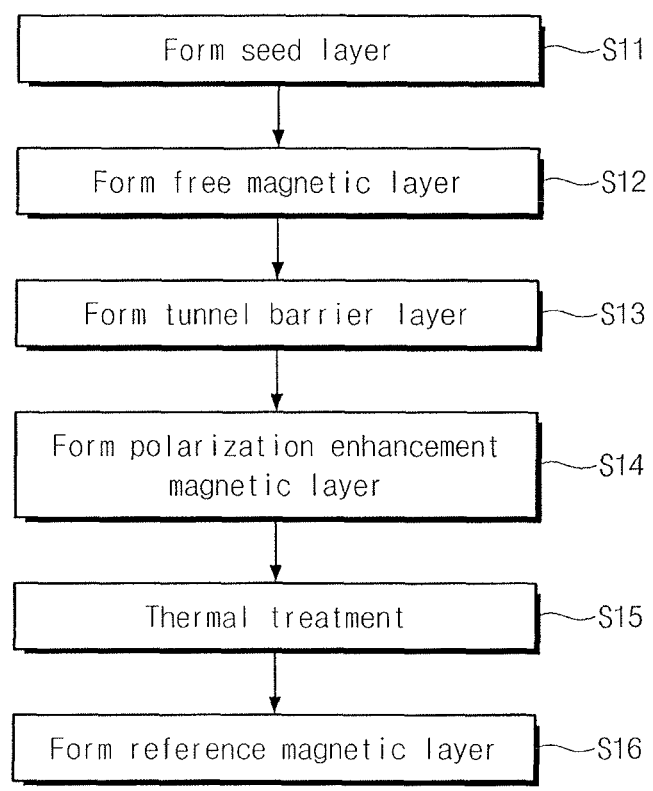
FIGS. 16 and 17 illustrate flow charts of methods of manufacturing a semiconductor memory device, according to some example embodiments.
Figure 17:
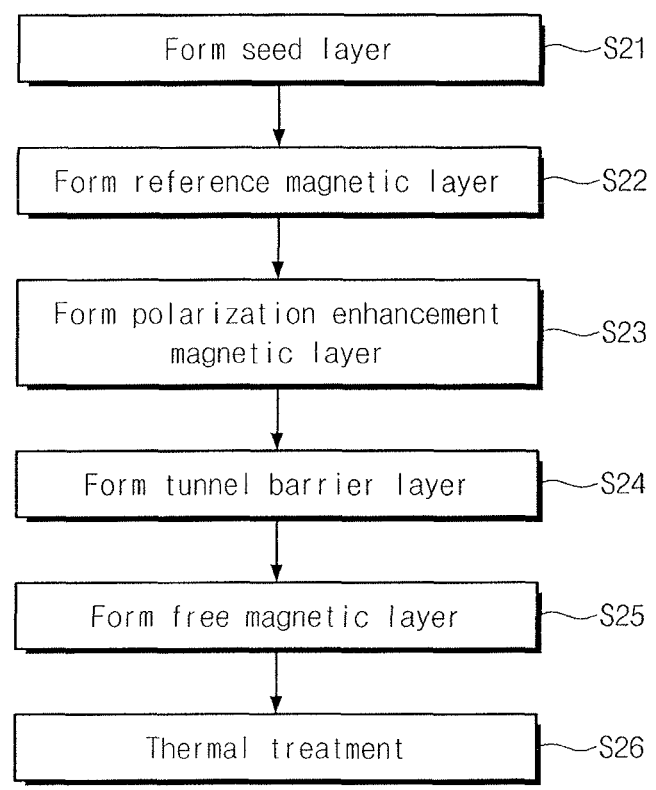

FIG. 9 is a plan view illustrating a semiconductor memory device according to some example embodiments. FIGS. 10 to 14 are cross-sectional views taken along line I-I' of FIG. 9 to illustrate stages in a method of manufacturing a semiconductor memory device, according to some example embodiments. FIG. 15 is a cross-sectional view taken along line II-II' of FIG. 9 to illustrate a semiconductor memory device according to some embodiments. FIGS. 16 and 17 are flow charts illustrating methods of manufacturing a semiconductor memory device, according to some embodiments.

Referring to FIGS. 9, 10, 15, and 16, device isolation patterns STI may be formed in a semiconductor substrate 100 to define active line patterns ALP. The semiconductor substrate 100 may be, e.g., a silicon substrate, a germanium substrate, or a silicon-germanium substrate. Each of the active line patterns ALP may be defined between the device isolation patterns STI adjacent to each other. In some embodiments, the active line patterns ALP may extend in a first direction D1 and may be spaced apart from each other in a second direction D2 perpendicular to the first direction D1.

The device isolation patterns STI may extend in the first direction D1 in parallel to the active line patterns ALP. The active line patterns ALP may be doped with dopants of a first conductive type.

Cell gate electrodes CG and isolation gate electrodes IG may be formed in the semiconductor substrate 100 to intersect the active line patterns ALP and the device isolation patterns STI. Top surfaces of the cell gate electrodes CG and top surfaces of the isolation gate electrodes IG may be lower than a top surface of the semiconductor substrate 100. The cell gate electrodes CG and the isolation gate electrodes IG may have linear shapes extending in the second direction D2 to intersect the active line patterns ALP. Gate hard mask patterns formed of an insulating material may be formed on the cell and isolation gate electrodes CG and IG, respectively. Top surfaces of the gate hard mask patterns may be substantially coplanar with the top surface of the semiconductor substrate 100. For example, the cell gate electrodes CG may include at least one of a semiconductor material doped with dopants (e.g., doped silicon), a metal (e.g., tungsten, aluminum, titanium, and/or tantalum), a conductive metal nitride (e.g., titanium nitride, tantalum nitride, and/or tungsten nitride), or a metal-semiconductor compound (e.g., a metal silicide). The isolation gate electrodes IG may be formed of the same material as the cell gate electrodes CG. The gate hard mask patterns may include at least one of an oxide (e.g., silicon oxide), a nitride (e.g., silicon nitride), or an oxynitride (e.g., silicon oxynitride).

Gate insulating layers GI may be formed between the semiconductor substrate 100 and the cell gate electrodes CG, and between the semiconductor substrate 100 and the isolation gate electrodes IG, respectively. The gate insulating layer GI may include at least one of an oxide (e.g., silicon oxide), a nitride (e.g., silicon nitride), an oxynitride (e.g., silicon oxynitride), or a high-k dielectric material (e.g., an insulating metal oxide such as hafnium oxide or aluminum oxide)

When the semiconductor memory device is operated, an isolation voltage may be applied to each of the isolation gate electrodes IG. The isolation voltage may prevent channels from being generated under the isolation gate electrodes IG. In other words, isolation channel regions under the isolation gate electrodes IG may be turned-off by the isolation voltage. Thus, memory cells adjacent to each other with the isolation gate electrode IG interposed therebetween may be electrically isolated from each other. For example, when the active line patterns ALP are doped with P-type dopants, the isolation voltage may be a ground voltage or a negative voltage.

First dopant regions 100a may be formed in the active line patterns ALP at one side of each of the cell gate electrodes CG, respectively, and second dopant regions 100b may be formed in the active line patterns ALP at another side of each of the cell gate electrodes CG, respectively. In some embodiments, each of the active line patterns ALP may be divided into a plurality of cell active portions and the cell gate electrodes CG may intersect the cell active portions. The cell active portions may be two-dimensionally arranged along the first and second directions D1 and D2. A pair of cell gate electrodes CG may intersect the cell active portions arranged in the second direction D2. In some embodiments, the first dopant region 100a may be disposed in each cell active portion between the pair of cell gate electrodes CG, and a pair of second dopant regions 100b may be respectively disposed in both edge regions of each active portion with the pair of cell gate electrodes CG interposed therebetween. Thus, a pair of cell transistors may share the first dopant region 100a. The first and second dopant regions 100a and 100b may correspond to source/drain regions of the cell transistor. The first and second dopant regions 100a and 100b may be doped with dopants of a second conductivity type different from the first conductivity type of the active line patterns ALP. One of the first and second conductivity types may be an N-type, and the other of the first and second conductivity types may be a P-type.

Next, a first interlayer insulating layer 101 may be formed on an entire top surface of the semiconductor substrate 100. Source lines SL may be formed in the first interlayer insulating layer 101 and may extend in parallel along the second direction D2. Each of the source lines SL may be disposed between the cell gate electrodes CG adjacent to each other when viewed from a plan view. Each of the source lines SL may be electrically connected to the first dopant regions 100a arranged in the second direction D2.

Top surfaces of the source lines SL may be substantially coplanar with a top surface of the first interlayer insulating layer 101. The source lines SL may include at least one of a semiconductor material doped with dopants (e.g., doped silicon), a metal (e.g., tungsten, aluminum, titanium, and/or tantalum), a conductive metal nitride (e.g., titanium nitride, tantalum nitride, and/or tungsten nitride), or a metal-semiconductor compound (e.g., a metal silicide).

A second interlayer insulating layer 103 may be formed on an entire top surface of the first interlayer insulating layer 101. The second interlayer insulating layer 103 may cover the top surfaces of the source lines SL. When the source lines SL include a metal, the second interlayer insulating layer 103 may be formed of an insulating material capable of preventing metal atoms included in the source lines SL from being diffused into the second interlayer insulating layer 103. In addition, the second interlayer insulating layer 103 may be formed of an insulating material having an etch selectivity with respect to the first interlayer insulating layer 101. For example, the first interlayer insulating layer 101 may be formed of an oxide (e.g., silicon oxide), and the second interlayer insulating layer 103 may be formed of at least one of a nitride (e.g., silicon nitride) or an oxynitride (e.g., silicon oxynitride).

Buried contact plugs BCP may be formed to sequentially penetrate the second interlayer insulating layer 103 and the first interlayer insulating layer 101. Each of the buried contact plugs BCP may be electrically connected to each of the second dopant regions 100b. Ohmic patterns may be formed between each of the buried contact plugs BCP and each of the second dopant regions 100b and between each of the source lines SL and each of the first dopant regions 100a, respectively. The ohmic patterns may include a metal-semiconductor compound (e.g., a metal silicide such as cobalt silicide or titanium silicide).

A third interlayer insulating layer 105 may be formed on the second interlayer insulating layer 103. The third interlayer insulating layer 105 may cover the buried contact plugs BCP.

Lower contact plugs LCP may be formed to penetrate the third interlayer insulating layer 105. The lower contact plugs LCP may be electrically connected to the buried contact plugs BCP, respectively. The lower contact plugs LCP may include at least one of, e.g., titanium (Ti), tantalum (Ta), tungsten (W), titanium nitride (TiN), tantalum nitride (TaN), tungsten nitride (WN), or titanium-aluminum nitride (TiAlN).

A bottom electrode layer 110 may be formed on the third interlayer insulating layer 105 and the lower contact plugs LCP. The bottom electrode layer 110 may include a conductive layer having low reactivity. For example, the bottom electrode layer 110 may include a conductive metal nitride. For example, the bottom electrode layer 110 may include at least one of titanium nitride (TiN), tantalum nitride (TaN), tungsten nitride (WN), or titanium-aluminum nitride (TiAlN).

In some example embodiments, a seed layer may be deposited on the third interlayer insulating layer 105 or the bottom electrode layer 110 (S11 in FIG. 16). The seed layer may be deposited by a physical vapor deposition (PVD) process, a chemical vapor deposition (CVD) process, or an atomic layer deposition (ALD) process. In some embodiments, the seed layer may be deposited by a sputtering process corresponding to the PVD process. The seed layer may be formed of a conductive material having the same crystal structure as a magnetic layer formed thereon. For example, the seed layer may have a body-centered cubic (BCC) crystal structure. For example, the seed layer may include ruthenium (Ru).

A free magnetic layer 120 may be deposited on the bottom electrode layer 110 or the seed layer (S12 in FIG. 16). For example, the free magnetic layer 120 may be formed of cobalt-iron-boron (CoFeB). The free magnetic layer 120 may be deposited by a PVD process, a CVD process, or an ALD process. In some embodiments, the free magnetic layer 120 may be deposited by a sputtering process. The deposited free magnetic layer 120 may partially have a crystalline structure or may be in an amorphous state.

A tunnel barrier layer 130 may be formed on the free magnetic layer 120 (S13 in FIG. 16). For example, the tunnel barrier layer 130 may be formed of magnesium oxide (MgO), e.g., with a NaCl crystal structure. The tunnel barrier layer 130 may be formed using a radio-frequency (RF) sputtering deposition process. For example, the tunnel barrier layer 130 may be deposited by a sputtering deposition process using a MgO target under an inert gas (e.g., an argon gas) atmosphere or may be deposited by a sputtering deposition using a Mg target and oxidation reaction under an oxygen atmosphere. In another example, the tunnel barrier layer 130 may be formed by alternately and repeatedly performing a process of depositing a magnesium layer on the free magnetic layer 120 and a process of oxidizing the magnesium layer. In certain embodiments, the tunnel barrier layer 130 may be formed by a molecular beam epitaxy (MBE) method or an electron beam deposition method using MgO.

A polarization enhancement magnetic layer 140 may be formed on the tunnel barrier layer 130 (S14 in FIG. 16). For example, the polarization enhancement magnetic layer 140 may be formed of cobalt-iron-boron (CoFeB). The polarization enhancement magnetic layer 140 may be deposited by a PVD process, a CVD process, or an ALD process. In some embodiments, the polarization enhancement magnetic layer 140 may be deposited by a sputtering process. The deposited polarization enhancement magnetic layer 140 may be in an amorphous state.

An intervening layer 150 may be formed on the polarization enhancement magnetic layer 140. The intervening layer 150 may be formed of at least one of, e.g., a tungsten layer, a tantalum layer, a ruthenium layer, a titanium layer, or a platinum layer.

The intervening layer 150 may have a different crystal structure from the polarization enhancement magnetic layer 140. For example, the intervening layer 150 may have a BCC crystal structure and may be formed of the tungsten layer. In another example, the intervening layer 150 may have an amorphous structure. The intervening layer 150 may be deposited by a PVD process, a CVD process, or an ALD process. In some embodiments, the intervening layer 150 may be deposited by a sputtering process.

Figure 11:
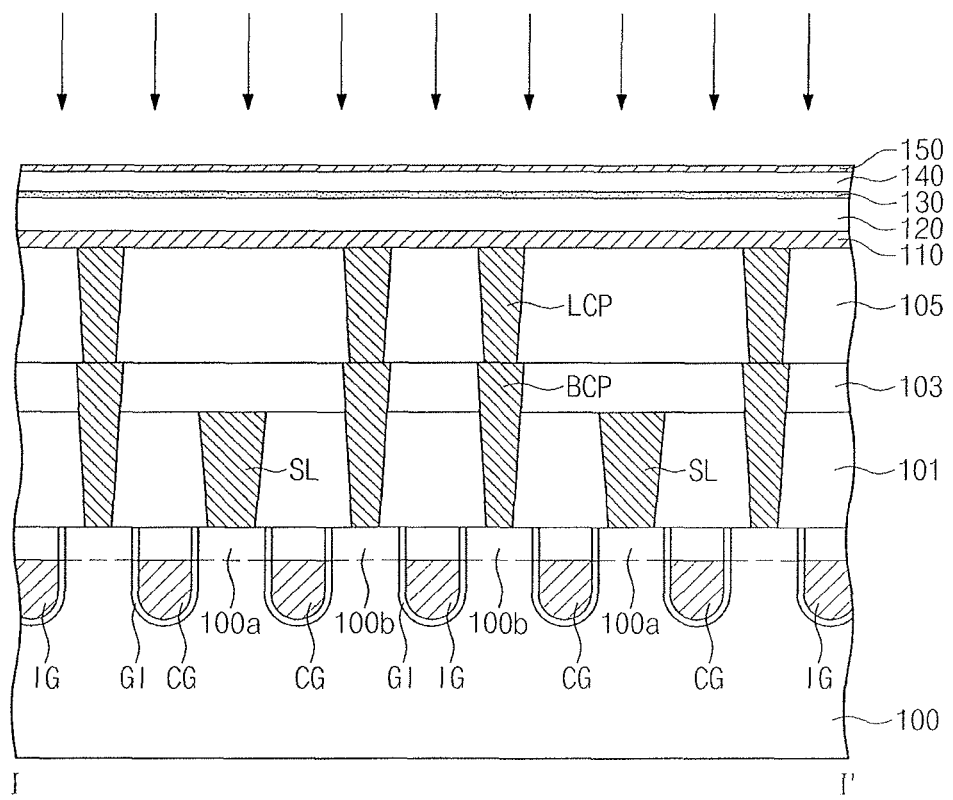

Referring to FIGS. 11 and 16, a thermal treatment process may be performed after the formation of the intervening layer 150 (S15). The polarization enhancement magnetic layer 140 and the free magnetic layer 120 may be crystallized by the thermal treatment process. Thus, a high tunneling magnetoresistance ratio may be obtained. To obtain a sufficient tunneling magnetoresistance ratio, the thermal treatment process may be performed a high temperature of about 400 degrees Celsius or more. For example, the process temperature of the thermal treatment process may range from about 400 degrees Celsius to about 600 degrees Celsius. The crystallized free magnetic layer 120 may have the same crystal structure as the crystallized polarization enhancement magnetic layer 140. The free magnetic layer 120 and the polarization enhancement magnetic layer 140 which are in contact with the tunnel barrier layer 130 may be crystallized using the tunnel barrier layer 130 as a seed during the thermal treatment process. Thus, the free magnetic layer 120 may have a similar crystal structure to the tunnel barrier layer 130, and the polarization enhancement magnetic layer 140 may also have a similar crystal structure to the tunnel barrier layer 130. In some embodiments, the free magnetic layer 120 and the polarization enhancement magnetic layer 140 may have a face-centered cubic (FCC) crystal structure, and the tunnel barrier layer 130 may have a sodium chloride (NaCl) crystal structure.

In some example embodiments, a process of etching the intervening layer 150 may be performed after the thermal treatment process. The intervening layer 150 may be etched by a plasma etching process. By the plasma etching process, a thickness of the intervening layer 150 may be reduced or the intervening layer 150 may be completely removed. Thus, the intervening layer 150 may be thinner than the polarization enhancement magnetic layer 140. Hereinafter, the embodiment in which the intervening layer 150 remains will be described as an example for the purpose of ease and convenience in explanation.

Figure 12:
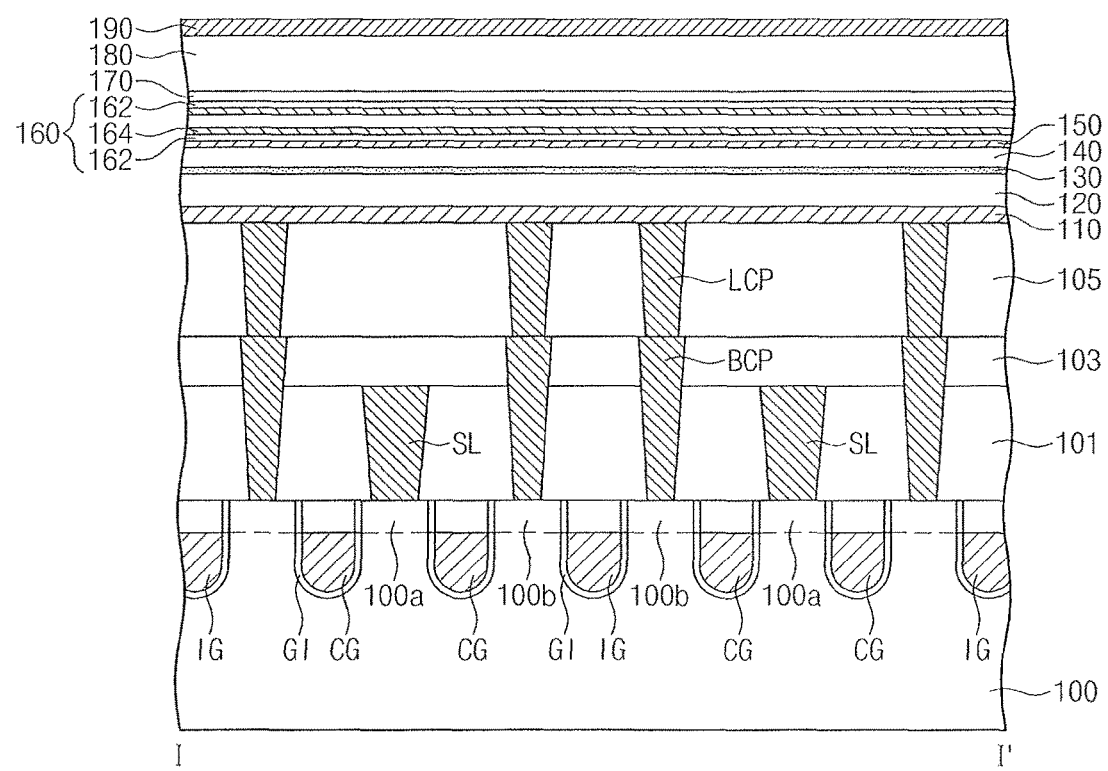

Referring to FIGS. 12 and 16, a reference magnetic layer may be formed on the intervening layer 150 after the thermal treatment process (S16). Forming the reference magnetic layer may include forming a first pinned layer 160, an exchange coupling layer 170, and a second pinned layer 180.

The first pinned layer 160 may be formed on the intervening layer 150. In some embodiments, forming the first pinned layer 160 may include alternately depositing first ferromagnetic layers 162 and first non-magnetic layers 164. For example, the first ferromagnetic layers 162 may be formed of at least one of iron (Fe), cobalt (Co), or nickel (Ni), and the first non-magnetic layers 164 may be formed of at least one of chromium (Cr), platinum (Pt), palladium (Pd), iridium (Ir), ruthenium (Ru), rhodium (Rh), osmium (Os), rhenium (Re), gold (Au), or copper (Cu). In some embodiments, the first ferromagnetic layers 162 may include cobalt (Co), and the first non-magnetic layers 164 may include iridium (Ir) or ruthenium (Ru). The first ferromagnetic layers 162 and the first non-magnetic layers 164 may be deposited by a PVD process, a CVD process, or an ALD process. In some embodiments, the first pinned layer 160 may have a BCC crystal structure.

In some example embodiments, depositing the first ferromagnetic layer 162 may be performed an odd number of times and depositing the first non-magnetic layer 164 may be performed an even number of times. At this time, thicknesses of the odd-numbered ones of the first ferromagnetic layers 162 may be smaller than those of the even-numbered ones of the first ferromagnetic layers 162. Alternatively, depositing the first ferromagnetic layer 162 may be performed an even number of times and depositing the first non-magnetic layer 164 may be performed an even number of times. In this case, thicknesses of the odd-numbered ones of the first ferromagnetic layers 162 may be substantially equal to those of the even-numbered ones of the first ferromagnetic layers 162. In some embodiments, the thicknesses of the first ferromagnetic layers 162 may range from about 1 Å to about 10 Å. Thicknesses of the first non-magnetic layers 164 may range from about 1 Å to about 10 Å.

For example, the first pinned layer 160 may have a [Co/Ir]n structure (where "n" is the number of bilayers) in which a cobalt layer having a thickness of about 1 Å to about 5 Å and an iridium layer having a thickness of about 1 Å to about 5 Å are alternately stacked a plurality of times.

The exchange coupling layer 170 may be disposed to be in contact with the first ferromagnetic layer of the first pinned layer 160. The exchange coupling layer 170 may be formed using the first pinned layer 160 as a seed. For example, the exchange coupling layer 170 may be formed of ruthenium (Ru) or iridium (Ir). The exchange coupling layer 170 may be deposited by a PVD process, a CVD process, or an ALD process. In some embodiments, the exchange coupling layer 170 may be deposited by a sputtering process.

The second pinned layer 180 may be formed on the exchange coupling layer 170. In some embodiments, forming the second pinned layer 180 may include alternately depositing second ferromagnetic layers and second non-magnetic layers. The second ferromagnetic layers and the second non-magnetic layers may be deposited by a PVD process, a CVD process, or an ALD process. For example, the second ferromagnetic layers may be formed of at least one of, e.g., iron (Fe), cobalt (Co), or nickel (Ni), and the second non-magnetic layers may be formed of at least one of chromium (Cr), platinum (Pt), palladium (Pd), iridium (Ir), ruthenium (Ru), rhodium (Rh), osmium (Os), rhenium (Re), gold (Au), or copper (Cu). In some embodiments, the second ferromagnetic layers may include cobalt (Co), and the second non-magnetic layers may include iridium (Ir) or ruthenium (Ru). In certain embodiments, the second ferromagnetic layers may include cobalt (Co), and the second non-magnetic layers may include platinum (Pt) or palladium (Pd).

In some example embodiments, depositing the second ferromagnetic layer may be performed an even number of times and depositing the second non-magnetic layer may be performed an even number of times. At this time, the number of the deposited second ferromagnetic layers may be more than the number of the deposited first ferromagnetic layers 162 of the first pinned layer 160. In addition, the number of the deposited second non-magnetic layers may be more than the number of the deposited first non-magnetic layers 164 of the first pinned layer 160. In some embodiments, thicknesses of the second ferromagnetic layers may range from about 1 Å to about 10 Å. Thicknesses of the second non-magnetic layers may range from about 1 Å to about 10 Å.

For example, the second pinned layer 180 may have a [Co/Pt]m structure (where "m" is the number of bilayers and is a natural number greater than "n") in which a cobalt layer having a thickness of about 1 Å to about 5 Å and a platinum layer having a thickness of about 1 Å to about 5 Å are alternately stacked a plurality of times.

In some example embodiments, the second pinned layer 180 may be formed of a CoPt alloy or a [CoPt]n L1$_1$ superlattice (where "n" is a natural number). When the second pinned layer 180 is formed of the CoPt alloy, the second pinned layer 180 may be deposited by a sputtering process using an argon gas. In this case, to reduce a saturation magnetization of the second pinned layer 180, the second pinned layer 180 may be formed of the CoPt alloy doped with boron. When the second pinned layer 180 is formed of the [CoPt]n L1$_1$ superlattice, the second pinned layer 180 may be deposited by a sputtering process using an inert gas (e.g., krypton (Kr)) having a greater mass than the argon gas, to improve perpendicular magnetic anisotropy of the [CoPt]n L1$_1$ superlattice.

A top electrode layer 190 may be formed on the second pinned layer 180. For example, the top electrode layer 190 may include a conductive metal nitride. For example, the top electrode layer 190 may include at least one of, e.g., titanium nitride (TiN), tantalum nitride (TaN), tungsten nitride (WN), or titanium-aluminum nitride (TiAlN). In another example, the top electrode layer 190 may include at least one of, e.g., a tantalum layer, a ruthenium layer, a titanium layer, or a platinum layer.

Figure 13:
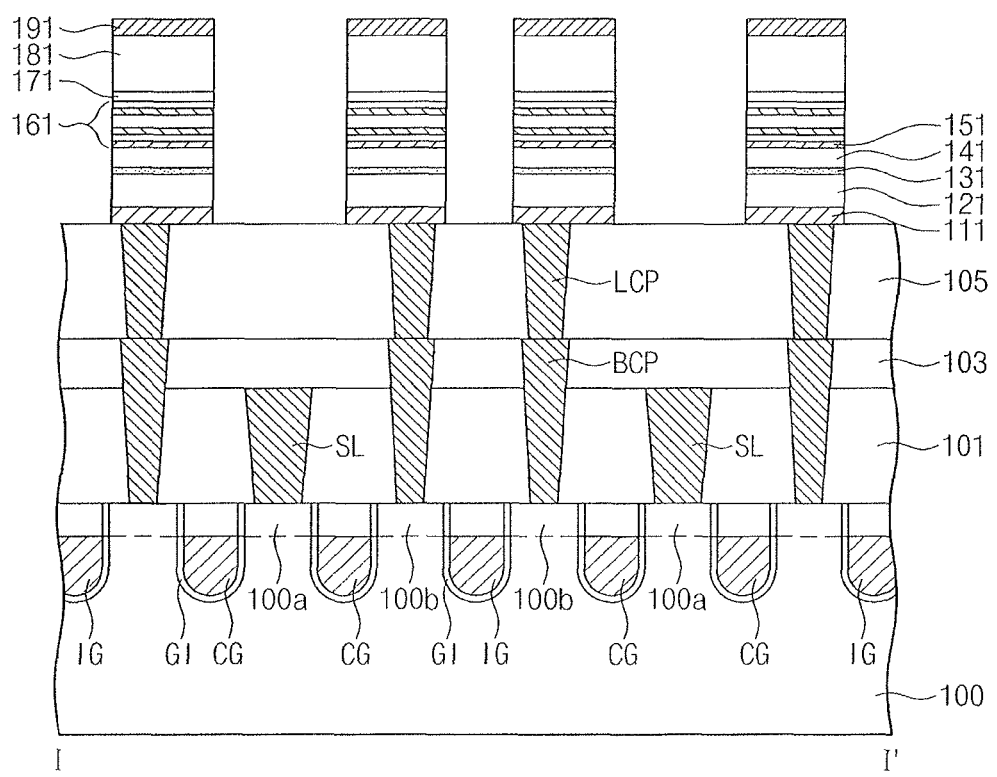
Figure 14:
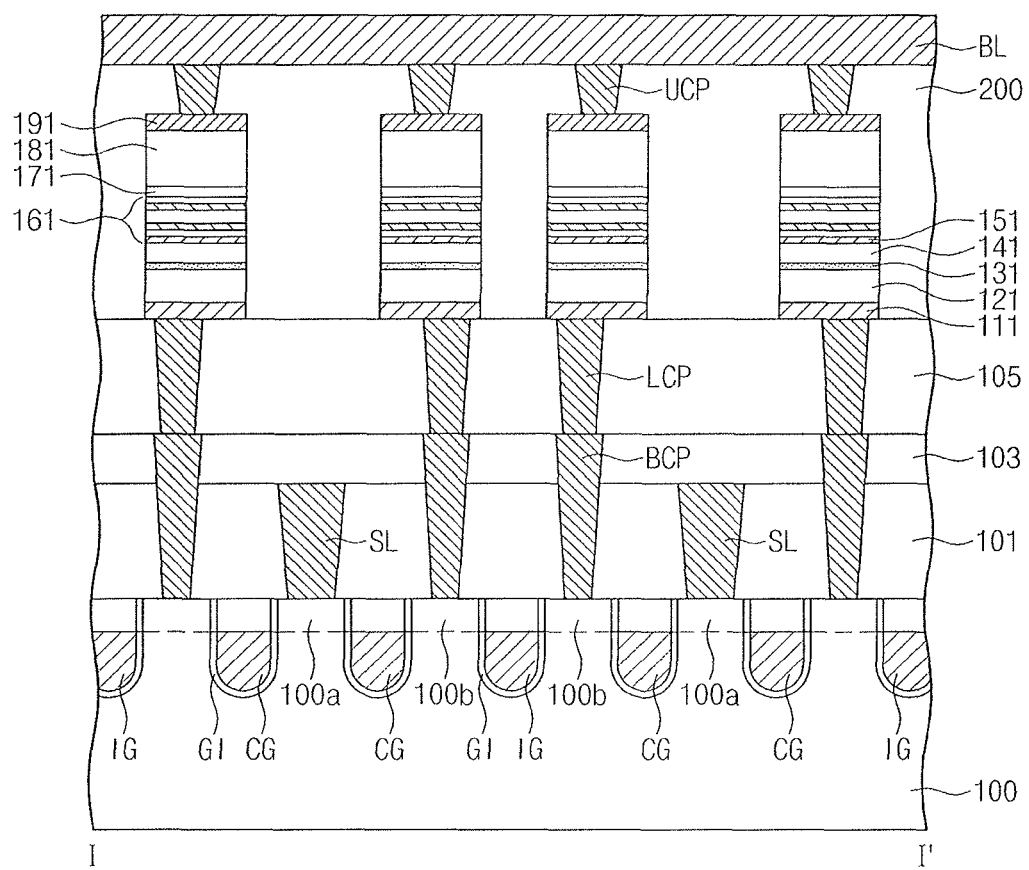

Next, the top electrode layer 190, the second pinned layer 180, the exchange coupling layer 170, the first pinned layer 160, the intervening layer 150, the polarization enhancement magnetic layer 140, the tunnel barrier layer 130, the free magnetic layer 120, and the bottom electrode layer 110 may be successively patterned to expose the top surface of the third interlayer insulating layer 105. Thus, as illustrated in FIG. 13, a magnetic tunnel junction pattern may be formed to include a bottom electrode pattern 111, a free magnetic pattern 121, a tunnel barrier pattern 131, a polarization enhancement magnetic pattern 141, an intervening pattern 151, a first pinned pattern 161, an exchange coupling pattern 171, a second pinned pattern 181, and a top electrode pattern 191 which are sequentially stacked. The magnetic tunnel junction pattern may be connected to each of the lower contact plugs LCP. In other words, a plurality of the magnetic tunnel junction patterns may be formed on the third interlayer insulating layer 105.

Subsequently, as illustrated in FIGS. 3 and 9, an upper interlayer insulating layer 200 may be formed to cover the magnetic tunnel junction pattern, and upper contact plug UCP may be formed to penetrate the upper interlayer insulating layer 200. The upper contact plugs UCP may be connected to the top electrode patterns 191, respectively. Next, interconnections BL connected to the upper contact plugs UCP may be formed on the upper interlayer insulating layer 200.

Hereinafter, a method of manufacturing a semiconductor memory device according to some example embodiments will be described. In the present embodiment, the descriptions of same technical features as described previously with respect to the embodiments of FIGS. 9 to 16 will be omitted or mentioned briefly for the purpose of ease and convenience in explanation.

Referring to FIG. 17, a seed layer may be formed on a bottom electrode layer 110 connected to a lower contact plug (S21). A reference magnetic layer may be formed on the seed layer (S22). Since the reference magnetic layer is formed on the seed layer, crystallizability of the reference magnetic layer may be improved. Thus, a thickness of the reference magnetic layer may be reduced. Forming the reference magnetic layer may include forming a first pinned layer 160, an exchange coupling layer 170, and a second pinned layer 180. As described above, forming the first pinned layer 160 may include alternately depositing the first ferromagnetic layers 162 and the first non-magnetic layers 164, and forming the second pinned layer 180 may include alternately depositing the second ferromagnetic layers and the second non-magnetic layers. Here, the first and second ferromagnetic layers may be formed of the same ferromagnetic material, and the first and second non-magnetic layers may be formed of different non-magnetic materials from each other. In some embodiments, the second pinned layer 180 of the reference magnetic layer may be in contact with the seed layer, and the second pinned layer 160 of the reference magnetic layer may be spaced apart from the seed layer.

Next, an intervening layer may be formed on the reference magnetic layer, and a polarization enhancement magnetic layer 140 may be formed on the intervening layer (S23). A tunnel barrier layer 130 may be formed on the polarization enhancement magnetic layer 140 (S24). A free magnetic layer 120 may be formed on the tunnel barrier layer 130 (S25). A thermal treatment process may be performed after the formation of the free magnetic layer 120 (S26).

In some example embodiments, since the first pinned layer of the reference magnetic layer includes iridium, of which the intermixing property is small at about 400 degrees Celsius or more, the perpendicular magnetic anisotropy of the reference magnetic layer may be maintained even though the thermal treatment process is performed at a high temperature of about 400 degrees Celsius after the formation of the reference magnetic layer. In other words, the heat-resistance property of the magnetic tunnel junction pattern may be improved. After the seed layer, the reference magnetic layer, the intervening layer, the polarization enhancement magnetic layer, the tunnel barrier layer 130, and the free magnetic layer 120 are formed as described above, a patterning process may be performed to form the magnetic tunnel junction pattern illustrated in FIG. 5.

By way of summation and review, according to some example embodiments, since the first pinned pattern adjacent to the free magnetic pattern includes first ferromagnetic patterns having magnetic moments coupled in anti-parallel to each other and first non-magnetic patterns, the magnitude of the net magnetic moment of the first pinned pattern may be reduced. Thus, the magnetic moment of the polarization enhancement magnetic pattern disposed between the first pinned pattern and the tunnel barrier pattern may be canceled by the magnetic moment of the second pinned pattern.

As a result, it is possible to reduce or minimize the stray magnetic field of the polarization enhancement magnetic pattern and the first and second pinned patterns. In other words, it is possible to reduce or minimize the phenomenon that the distribution of the switching field of the free magnetic pattern is shifted. This means that the switching characteristic of the magnetic tunnel junction pattern may be improved, e.g., a switching probability margin in perpendicular-MTJ by SAF pinned layer composed of Co/Ir multilayer may be improved. In addition, since the first non-magnetic patterns of the first pinned pattern are formed of iridium (Ir), the perpendicular magnetic anisotropy of the first pinned pattern may be maintained under a high-temperature process condition.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device comprising:
   a substrate;
   a reference magnetic pattern disposed on the substrate, and including a first pinned pattern, a second pinned pattern, and an exchange coupling pattern;
   an intervening pattern disposed on the reference magnetic pattern;
   a polarization enhancement magnetic pattern disposed on the intervening pattern;
   a tunnel barrier pattern disposed on the polarization enhancement magnetic pattern; and
   a free magnetic pattern disposed on the tunnel barrier pattern,
   wherein the exchange coupling pattern is disposed on the second pinned pattern,
   the first pinned pattern is disposed on the exchange coupling pattern,
   the first pinned pattern includes first ferromagnetic patterns and first non-magnetic patterns that are alternately stacked,
   the first ferromagnetic patterns includes cobalt (Co),
   the first non-magnetic patterns includes iridium (Ir), and
   the second pinned pattern includes cobalt-platinum (CoPt) and/or CoPt alloy.

2. The semiconductor device of claim 1, wherein each of the first non-magnetic patterns includes a non-magnetic material that couples adjacent first ferromagnetic patterns to have magnetic moments of the adjacent first ferromagnetic patterns anti-parallel to each other.

3. The semiconductor device of claim 1, wherein the second pinned pattern includes a first element that is the same ferromagnetic material as the first ferromagnetic patterns, and a second element that is a different non-magnetic material from the first non-magnetic patterns.

4. The semiconductor device of claim 1, wherein the first pinned pattern has a different crystal structure from the polarization enhancement magnetic pattern.

5. The semiconductor device of claim 1, wherein the polarization enhancement magnetic pattern has the same crystal structure as the free magnetic pattern.

6. The semiconductor device of claim 1, wherein the intervening pattern contacts first one of the first ferromagnetic patterns, and
   the exchange coupling pattern contacts second one of the first ferromagnetic patterns.

7. The semiconductor device of claim 1, further comprising an interlayer insulating layer disposed between the substrate and the reference magnetic pattern.

8. The semiconductor device of claim 7, further comprising a contact plug penetrating the interlayer insulating layer.

9. The semiconductor device of claim 1, wherein the tunnel barrier pattern includes a plurality of layers.

10. A semiconductor device comprising:
    a substrate;
    a reference magnetic pattern disposed on the substrate, and including a first pinned pattern, a second pinned pattern, and an exchange coupling pattern;
    an intervening pattern disposed on the reference magnetic pattern;
    a polarization enhancement magnetic pattern disposed on the intervening pattern;
    a tunnel barrier pattern disposed on the polarization enhancement magnetic pattern; and
    a free magnetic pattern disposed on the tunnel barrier pattern,
    wherein the exchange coupling pattern is disposed on the second pinned pattern,
    the first pinned pattern is disposed on the exchange coupling pattern,
    the first pinned pattern includes first ferromagnetic patterns and first non-magnetic patterns that are alternately stacked,
    each of the first non-magnetic patterns includes a non-magnetic material having an anti-ferromagnetic coupling property, and
    the second pinned pattern includes CoPt or CoPt alloy.

11. The semiconductor device of claim 10, wherein the first ferromagnetic patterns includes cobalt (Co), and
    the first non-magnetic patterns includes iridium (Ir).

12. The semiconductor device of claim 10, wherein the non-magnetic material included in each of the first non-magnetic patterns couples adjacent first ferromagnetic patterns to have magnetic moments of the adjacent first ferromagnetic patterns anti-parallel to each other.

13. The semiconductor device of claim 10, wherein the number of the first ferromagnetic patterns included in the first pinned pattern is an odd number, and
    the number of the first non-magnetic patterns included in the first pinned pattern is an even number.

14. The semiconductor device of claim 10, wherein the exchange coupling pattern couples the first pinned pattern and the second pinned pattern to each other.

15. The semiconductor device of claim 10, wherein the exchange coupling pattern includes ruthenium (Ru), iridium (Ir), chromium (Cr) or rhodium (Rh).

16. A semiconductor device comprising:
    a substrate;
    a reference magnetic pattern disposed on the substrate, and including a first pinned pattern, a second pinned pattern, and an exchange coupling pattern;
    an intervening pattern disposed on the reference magnetic pattern;
    a polarization enhancement magnetic pattern disposed on the intervening pattern;
    a tunnel barrier pattern disposed on the polarization enhancement magnetic pattern; and
    a free magnetic pattern disposed on the tunnel barrier pattern,
    wherein the exchange coupling pattern is disposed on the second pinned pattern,
    the first pinned pattern is disposed on the exchange coupling pattern,
    the first pinned pattern includes first ferromagnetic patterns and first non-magnetic patterns that are alternately stacked,
    the first ferromagnetic patterns includes cobalt (Co),
    the first non-magnetic patterns includes iridium (Ir), and
    the second pinned pattern includes a first element that is the same ferromagnetic material as the first ferromagnetic patterns, and a second element that is a different non-magnetic material from the first non-magnetic patterns.

17. The semiconductor device of claim 16, wherein the second pinned pattern includes CoPt or CoPt alloy.

18. The semiconductor device of claim 16, wherein each of the first non-magnetic patterns includes a non-magnetic material that couples adjacent first ferromagnetic patterns to have magnetic moments of the adjacent first ferromagnetic patterns anti-parallel to each other.

19. The semiconductor device of claim 16, wherein the intervening pattern contacts first one of the first ferromagnetic patterns, and
the exchange coupling pattern contacts second one of the first ferromagnetic patterns.

20. The semiconductor device of claim 16, wherein the polarization enhancement magnetic pattern includes cobalt (Co), iron (Fe) or nickel (Ni).

* * * * *